(12) United States Patent
Wang et al.

(10) Patent No.: US 11,204,409 B2
(45) Date of Patent: Dec. 21, 2021

(54) SYSTEMS AND METHODS FOR MOTION-COMPENSATED RECONSTRUCTION OF MAGNETIC RESONANCE IMAGES

(71) Applicant: University of Virginia Patent Foundation, Charlottesville, VA (US)

(72) Inventors: Luonan Wang, Auburn, CA (US); Daniel Stuart Weller, Charlottesville, VA (US); John P. Mugler, III, Charlottesville, VA (US); Craig H. Meyer, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 102 days.

(21) Appl. No.: 16/599,853

(22) Filed: Oct. 11, 2019

(65) Prior Publication Data
US 2020/0116810 A1   Apr. 16, 2020

Related U.S. Application Data

(60) Provisional application No. 62/744,355, filed on Oct. 11, 2018.

(51) Int. Cl.
*G01V 3/00* (2006.01)
*G01R 33/565* (2006.01)
(Continued)

(52) U.S. Cl.
CPC .... *G01R 33/56509* (2013.01); *G01R 33/5611* (2013.01); *G01R 33/5676* (2013.01); *G01R 33/56308* (2013.01); *G01R 33/58* (2013.01)

(58) Field of Classification Search
CPC ............. G01R 33/543; G01R 33/5659; G01R 33/3415; G01R 33/36; A61B 5/055
(Continued)

(56) References Cited

U.S. PATENT DOCUMENTS

| 7,084,877 | B1 * | 8/2006 | Panusopone | H04N 19/56 345/474 |
| 7,583,082 | B1 | 9/2009 | Hu et al. | |

(Continued)

OTHER PUBLICATIONS

Adluru, G. et al., "Model based registration for dynamic cardiac perfusion MRI," *Journal of Magnetic Resonance Imaging*, 24(5), pp. 1062-1070, Oct. 9, 2006.
(Continued)

*Primary Examiner* — Walter L Lindsay, Jr.
*Assistant Examiner* — Frederick Wenderoth
(74) *Attorney, Agent, or Firm* — Finnegan, Henderson, Farabow, Garrett & Dunner LLP

(57) ABSTRACT

Systems and methods for reconstructing a motion-compensated magnetic resonance image are presented. In certain implementations, a computer-implemented method is provided. The method may include a plurality of operations, including receiving a set of k-space data from a magnetic resonance imaging device, dividing the set of k-space data into a plurality of groups, performing a plurality of initialization operations, performing a first iterative process until a first criteria for the first iterative process is achieved for a current scale of motion estimation, performing a second iterative process until a second criteria for the second iterative process is achieved, and outputting a motion-compensated magnetic resonance image reconstructed in accordance with a predetermined scale of motion estimation.

20 Claims, 20 Drawing Sheets

(51) Int. Cl.
  G01R 33/58   (2006.01)
  G01R 33/567  (2006.01)
  G01R 33/561  (2006.01)
  G01R 33/563  (2006.01)
(58) Field of Classification Search
  USPC .................................................... 324/309
  See application file for complete search history.

(56) References Cited

U.S. PATENT DOCUMENTS

| | | | |
|---|---|---|---|
| 7,888,935 B1 | 2/2011 | Tan et al. | |
| 8,026,720 B1 | 9/2011 | Chen et al. | |
| 8,306,289 B1 | 11/2012 | Meyer et al. | |
| 8,473,028 B2 | 6/2013 | Mitsouras et al. | |
| 9,279,873 B2 | 3/2016 | Xue et al. | |
| 9,427,171 B2 | 8/2016 | Gdaniec et al. | |
| 9,594,141 B2 | 3/2017 | Weller et al. | |
| 9,989,611 B2 | 6/2018 | Zhao et al. | |
| 10,143,384 B2 | 12/2018 | Chen et al. | |
| 2011/0006768 A1* | 1/2011 | Ying | G01R 33/5611 324/309 |
| 2012/0092009 A1 | 4/2012 | Zhang et al. | |
| 2014/0334705 A1* | 11/2014 | Ishii | G06T 11/008 382/131 |
| 2015/0234024 A1* | 8/2015 | Grodzki | G01R 33/4824 324/309 |
| 2015/0325001 A1* | 11/2015 | Riemens | G06T 7/20 382/103 |
| 2015/0346303 A1* | 12/2015 | Hu | G01R 33/5611 600/420 |
| 2015/0355347 A1* | 12/2015 | Pratx | A61B 6/037 600/426 |
| 2017/0328972 A1 | 11/2017 | Fielden et al. | |
| 2018/0292499 A1 | 10/2018 | Meyer et al. | |

OTHER PUBLICATIONS

Adluru, G. et al., "Acquisition and reconstruction of undersampled radial data for myocardial perfusion magnetic resonance imaging," *Journal of Magnetic Resonance Imaging*, 29(2), pp. 466-473, Feb. 2009.

Asif, M.S. et al., "Motion-adaptive spatio-temporal regularization for accelerated dynamic MRI," *Magnetic Resonance in Medicine*, 70(3), pp. 800-812, Nov. 6, 2012.

Atkinson, D. et al., "An autofocus algorithm for the automatic correction of motion artifacts in MR images," IPMI 1997: *Information Processing in Medical Imaging*, pp. 341-354, Jun. 1997.

Batchelor, P.G. et al., "Matrix description of general motion correction applied to multishot images," *Magnetic Resonance in Medicine*, 54(5), pp. 1273-1280, Sep. 9, 2005.

Chen, W. et al., "Semiautomatic off-resonance correction in spiral imaging," *Magnetic Resonance in Medicine*, 59(5), pp. 1212-1219, May 2008.

Chen, F. et al., "Autocalibrating motion-corrected wave-encoding for highly accelerated free-breathing abdominal MRI", *Magnetic Resonance in Medicine*, 78(5), pp. 1757-1766, Dec. 9, 2016.

Chen, X. et al., "Motion-compensated compressed sensing for dynamic contrast-enhanced MRI using regional spatiotemporal sparsity and region tracking: Block LOw-rank sparsity with motion-guidance (BLOSM)," *Magnetic Resonance in Medicine*, 72(4), pp. 1028-1038, Nov. 18, 2013.

Cheng, J.Y. et al., "Nonrigid motion correction in 3D using autofocusing with localized linear translations," *Magnetic Resonance in Medicine*, 68(6), pp. 1785-1797, Feb. 3, 2012.

Cheng, J.Y. et al., "Free-breathing pediatric MRI with nonrigid motion correction and acceleration," *Journal of Magnetic Resonance Imaging*, 42(2), pp. 407-420, Aug. 2015, <doi: 10.1002/jmri.24785>.

Cheng, J.T. et al., "Comprehensive Multi-Dimensional MRI for the Simultaneous Assessment of Cardiopulmonary Anatomy and Physiology," *Scientific Reports*, 7(1), pp. 5330-5345, Jul. 13, 2017.

Christodoulou, A.G. et al., "Non-ECG First-Pass Myocardial Perfusion T1 Mapping with Low-Rank Tensor Cardiovascular MR Multitasking," *Proceedings of the International Society of Magnetic Resonance in Medicine* 25, program No. 0140, Apr. 22-27, 2017 [retrieved on Sep. 18, 2019], Retrieved from the Internet:< URL: indexsmart.mirasmart.com/ISMRM2017/PDFfiles/0450.html>.

Chun, S.Y. et al., "A Simple Regularizer for B-spline Nonrigid Image Registration That Encourages Local Invertibility," *IEEE Journal of Selected Topics in Signal Processing*, 3(1), pp. 159-169, Feb. 1, 2009.

Chun, S.Y., "Motion Aspects in Joint Image Reconstruction and Nonrigid Motion Estimation", Dissertation, University of Michigan, pp. 1-145, 2009.

Fayad, H. et al., "The use of a generalized reconstruction by inversion of coupled systems (GRICS) approach for generic respiratory motion correction in PET/MR imaging," *Physics in Medicine & Biology*, 60(6), pp. 2529-2546, Mar. 6, 2015.

Fletcher, R. et al., "Function minimization by conjugate gradients," *The Computer Journal*, 7(2), pp. 149-154, Jan. 1, 1964.

Feng, L. et al., "Golden-angle radial sparse parallel MRI: Combination of compressed sensing, parallel imaging, and golden-angle radial sampling for fast and flexible dynamic volumetric MRI," *Magnetic Resonance in Medicine*, 72(3), pp. 707-717, Oct. 18, 2013.

Feng, L. et al., "XD-GRASP: Golden-angle radial MRI with reconstruction of extra motion-state dimensions using compressed sensing," *Magnetic Resonance in Medicine*, 75(2), pp. 775-788, Mar. 25, 2015.

Hamilton, Jesse et al., "Recent Advances in Parallel Imaging for MRI", *Progress in Nuclear Magnetic Resonance Spectroscopy*, 101:71-95, Aug. 1, 2017.

Hu, P.S. et al., "Motion correction using coil arrays (MOCCA) for free-breathing cardiac cine MRI," *Magnetic Resonance in Medicine*, 66(2), pp. 467-475, Feb. 24, 2011.

Ingle, R.R. et al., "Nonrigid autofocus motion correction for coronary MR angiography with a 3D cones trajectory," *Magnetic Resonance in Medicine*, 72(2), pp. 347-361, Sep. 4, 2013.

Irarrazabal, P. et al., "Fast Three Dimensional Magnetic Resonance Imaging," *Magnetic Resonance in Medicine*, 33(5), pp. 656-662, May 1995.

Jeelani, H. et al., "Evaluation of k-Space and Image-Space Motion Correction Schemes for CMR Perfusion," *20th Annual SCMR Scientific Sessions*, Washington, DC, USA, Feb. 2017, P046, [retrieved on Dec. 5, 2019], Retrieved from the Internet:< URL: http://people.virginia.edu/~dsw8c/papers/jeelani-17-eok.pdf>.

Jin, N. et al., "Free-breathing myocardial T2* mapping using GRE-EPI and automatic Non-rigid motion correction," *Journal of Cardiovascular Magnetic Resonance*, 17(1), 113, Dec. 23, 2015, <doi:10.1186/s12968-015-0216-z>.

Jung, H. et al., "Radial k-t FOCUSS for high-resolution cardiac cine MRI," *Magnetic Resonance in Medicine*, 63(1), pp. 68-78, 2010.

Jung, H. et al., "k-t FOCUSS: A general compressed sensing framework for high resolution dynamic MRI," *Magnetic Resonance in Medicine*, 61(1), pp. 103-116, Jan. 2009, < DOI 10.1002/mrm.21757>.

Kellman, P. et al., "High spatial and temporal resolution cardiac cine MRI from retrospective reconstruction of data acquired in real time using motion correction and resorting," *Magnetic Resonance in Medicine*, 62(6), pp. 1557-1564, Sep. 24, 2009.

Lee, Jin H. et al., "Fast 3D Imaging Using Variable-Density Spiral Trajectories with Applications to Limb Perfusion", *Magnetic Resonance in Medicine*, 50:1276-1285, Dec. 2003.

Lingala, S.G. et al., "Deformation Corrected Compressed Sensing (DC-CS): A Novel Framework for Accelerated Dynamic MRI," *IEEE Transactions on Medical Imaging*, 34(1), pp. 72-85, Jan. 2015.

Loktyushin, A. et al., "Blind multirigid retrospective motion correction of MR images," *Magnetic Resonance in Medicine*, 73(4), pp. 1457-1468, Apr. 23, 2014.

(56) References Cited

OTHER PUBLICATIONS

Lustig et al., "SPIRIT: Iterative self-consistent parallel imaging reconstruction from arbitrary k-space," *Magnetic Resonance in Medicine*, 64(2), pp. 457-471, Aug. 2010.

McGee, K.P. et al., "Image metric based correction (Autocorrection) of motion effects: Analysis of image metrics," *Journal of Magnetic Resonance Imaging*, 11(2), pp. 174-181, Feb. 2000.

Mohsin, Q. et al., "Accelerated dynamic MRI using patch regularization for implicit motion compensation," *Magnetic Resonance in Medicine*, 77(3), pp. 1238-1248, Apr. 19, 2016.

Odille, F. et al., "Generalized Reconstruction by Inversion of Coupled Systems (GRICS) applied to free-breathing MRI," *Magnetic Resonance in Medicine*, 60(1), pp. 146-157, Oct. 30, 2017.

Odille, F. et al., "Joint Reconstruction of Multiple Images and Motion in MRI: Application to Free-Breathing Myocardial T2 Quantification," *IEEE Transactions on Medical Imaging*, 35(1), pp. 197-207, Jul. 30, 2015.

Paige, C.C., et al., "LSQR: An Algorithm for Sparse Linear Equations and Sparse Least Squares," *ACM Transactions on Mathematical Software*, 8(1), pp. 43-71, Mar. 1982.

Shaw, J.L. et al., "Ungated, free-breathing native T1 mapping in multiple cardiac phases in under one minute: a proof of concept," *Proceedings of the International Society of Magnetic Resonance in Medicine 24*, program No. 3149, May 10, 2016, [retrieved on Sep. 18, 2019], Retrieved from the Internet:< URL: https://index.mirasmart.com/ISMRM2016/PDFfiles/3149.html>.

Unser, Michael et al., "Fast B-Spline Transforms for Continuous Image Representation and Interpolation", *IEEE Transactions on Pattern Analysis and Machine Intelligence*, vol. 13, No. 3, pp. 277-285, Mar. 1991.

Viergever, M.A. et al., "A survey of medical image registration—under review," *Medical Image Analysis*, 33, pp. 140-144, Oct. 2016.

Wang, Zhou et al., "Image quality assessment: from error visibility to structural similarity," *IEEE Transactions on Image Processing*, 13(4), pp. 600-612, Apr. 2004.

Wang, L. et al. "Joint Motion Estimation and Image Reconstruction Using Alternating Minimization," *Proceedings of the International Society of Magnetic Resonance in Medicine 24*, program No. 1800, May 10, 2016, [retrieved on Dec. 5, 2019], Retrieved from the Internet:< URL: https://index.mirasmart.com/ISMRM2016/PDFfiles/1800.html >.

Weller, D.S. et al., "Augmented Lagrangian with Variable Splitting for Faster Non-Cartesian $L_1$-SPIRiT MR Image Reconstruction", *IEEE Trans Med Imaging*, 33(2): 351-361, Feb. 2014, <doi:10.1109/TMI.2013.2285046>.

Weller, Daniel S. et al., "Motion-compensated reconstruction of magnetic resonance images from undersampled data", *Magnetic Resonance Imaging*, 55: 36-45, Jan. 2019.

Yang, H. et al., "Free-breathing, motion-corrected, highly efficient whole heart T2 mapping at 3T with hybrid radial-cartesian trajectory," Magnetic Resonance in Medicine, 75(1), pp. 126-136, Mar. 6, 2015.

Yoon, H. et al., "Motion compensated compressed sensing dynamic MRI with low-rank patch-based residual reconstruction," *Proc. IEEE International Symposium on Biomedical Imaging (ISBI)*, pp. 314-317, Apr. 7-11, 2013.

Zaitsev, M. et al., "Motion artifacts in MRI: A complex problem with many partial solutions," *Journal of Magnetic Resonance Imaging*, 42(4), pp. 887-901, Oct. 2015.

Zucker, E.J. et al., "Free breathing pediatric chest MRI: Performance of self-navigated golden angle ordered conical ultrashort echo time acquisition," *Journal of Magnetic Resonance Imaging*, 47(1), pp. 200-209, Jun. 1, 2017, <doi: 10.1002/jmri.25776>.

\* cited by examiner

SYSTEMS AND METHODS FOR MOTION-COMPENSATED RECONSTRUCTION OF MAGNETIC RESONANCE IMAGES

CROSS-REFERENCE TO RELATED APPLICATION

This application is based upon and claims the benefit of priority of U.S. Provisional Application No. 62/744,355, filed on Oct. 11, 2018, the entirety of which is incorporated herein by reference.

GOVERNMENT LICENSE RIGHTS

This invention was made with government support under Grant No. EB022309, awarded by the National Institute of Health. The government has certain rights in the invention.

TECHNICAL FILED

The present disclosure relates to magnetic resonance imaging (MRI), including systems and methods for performing MRI. More particularly, and without limitation, the disclosed embodiments relate to, among other things, systems and methods for reconstructing motion-compensated magnetic resonance (MR) images.

BACKGROUND

MRI is an essential technology for modern medicine. MRI can be used to generate high-resolution anatomical and functional images, and it is relatively safe due to the lack of ionizing radiation. However, one of the main drawbacks of MRI is the long scan time required to localize the MR signal to generate an image. The long scan time makes MM sensitive to motion during signal acquisition, which is a major source of artifacts for MR images.

Motion artifacts in MR images can come from a number of sources including respiration, cardiac motion, blood flow, and patient movement. For instance, breathing or respiratory motion can move internal organs, such as the heart, liver, or kidneys, during a scan. Cardiac motion can distort MR images of the heart as well. Gating or triggering techniques (e.g., using a respiratory belt, electrocardiogram, or navigator) can suppress these motion effects, but at the cost of less efficient acquisitions. Inconsistent breathing, arrhythmia, or inaccurate physiological monitoring also can diminish the effectiveness of such methods. Additionally, such methods do not address other sources of motion, such as patient movement (also referred to as bulk motion) during the scan. Certain patient populations, including young children, cancer patients, and those with neurological or neurodegenerative disorders can have difficulty lying still for extended periods and would be expected to move during longer scans.

Parallel imaging, a class of fast MRI imaging techniques, have recently been developed to reduce MM scan time by sampling a smaller number of phase encoding data in the k-space. Such fast MRI techniques can be used to increase image resolution, increase volumetric coverage, and/or improve patient compliance during signal acquisition. However, motion artifacts still exist in fast imaging and need to be addressed for certain applications. For example, bulk and respiratory motion during fast MM scans can affect high-resolution abdominal MR images, such as those used to monitor and plan treatment for liver cancer (e.g., hepatoblastoma) in young children. While sedation can address the bulk motion, doing so precludes breath-holds, poses risks for young children, and requires an anesthesiologist to be present. The need for an anesthesiologist makes scheduling such exams challenging. Even without sedation, repeated breath-holds may be difficult for these children, limiting the achievable resolution and image quality of abdominal images. Alternative imaging techniques, such as X-ray computed tomography, can pose radiation-related risks to these young child subjects. Therefore, there is a need to suppress the effects of motion artifacts in MR images, and in particular, in MR images acquired by fast, high-resolution MM techniques.

SUMMARY

The embodiments of the present disclosure provide systems and methods for reconstructing motion-compensated MR images. Advantageously, the exemplary embodiments allow for suppressing motion artifacts in MR images caused by nonrigid motion that occurred during conventional or accelerated MM scans.

According to an exemplary embodiment of the present disclosure, a computer-implemented method for reconstructing a motion-compensated MR image is provided. The method includes receiving a set of k-space data from an MRI device; dividing the set of k-space data into a plurality of groups; performing a plurality of initialization operations; performing a first iterative process until a first criteria for the first iterative process is achieved; and performing a second iterative process until a second criteria for the second iterative process is achieved. In some embodiments, the first iterative process outputs, for a current scale of motion estimation, a set of deformation coefficients of a motion estimation model for each group of k-space data. The first iterative process further outputs a motion-compensated MR image reconstructed based on all the sets of the deformation coefficients and all the groups of k-space data. In some embodiments, the second iterative process outputs a final motion-compensated MR image reconstructed based on the output of the first iterative process and a predetermined scale of motion estimation.

According to another exemplary embodiment of the present disclosure, a non-transitory computer readable medium is provided. The non-transitory computer readable medium stores a set of instructions that is executable by at least one processor to cause the processor to perform a method for reconstructing a motion-compensated MR image. The method includes receiving a set of k-space data from an MRI device; dividing the set of k-space data into a plurality of groups; performing a plurality of initialization operations; performing a first iterative process until a first criteria for the first iterative process is achieved; and performing a second iterative process until a second criteria for the second iterative process is achieved. In some embodiments, the first iterative process outputs, for a current scale of motion estimation, a set of deformation coefficients of a motion estimation model for each group of k-space data. The first iterative process further outputs a motion-compensated MR image reconstructed based on all the sets of the deformation coefficients and all the groups of k-space data. In some embodiments, the second iterative process outputs a final motion-compensated MR image reconstructed based on the output of the first iterative process and a predetermined scale of motion estimation.

According to another exemplary embodiment of the present disclosure, a method for performing MM. The method includes acquiring a set of k-space data; dividing the set of k-space data into a plurality of groups; performing a plurality of initialization operations; performing a first iterative process until a first criteria for the first iterative process is achieved; and performing a second iterative process until a second criteria for the second iterative process is achieved. In some embodiments, the set of k-space data are acquired simultaneously by a plurality of independent receiver coil arrays. In some embodiments, the set of k-space data are acquired based on a selected sampling pattern. In some embodiments, the first iterative process outputs, for a current scale of motion estimation, a set of deformation coefficients of a motion estimation model for each group of k-space data. The first iterative process further outputs a motion-compensated MR image reconstructed based on all the sets of the deformation coefficients and all the groups of k-space data. In some embodiments, the second iterative process outputs a final motion-compensated MR image reconstructed based on the output of the first iterative process and a predetermined scale of motion estimation.

Additional disclosure of the disclosed embodiments will be set forth in part in the description that follows. It is to be understood that both the foregoing general description and the following detailed description are examples and explanatory only and are not restrictive of the disclosed embodiments as claimed.

The accompanying drawings constitute a part of this specification. The drawings illustrate several embodiments of the present disclosure and, together with the description, serve to explain the principles of certain disclosed embodiments as set forth in the accompanying claims.

DETAILED DESCRIPTION

Reference will now be made in detail to the exemplary embodiments of the present disclosure described below and illustrated in the accompanying drawings. Wherever possible, the same reference numbers will be used throughout the drawings to refer to the same or like parts.

While the present disclosure is described herein with reference to illustrative embodiments of particular applications, such as MRI or parallel MRI, it is understood that the embodiments described herein are not limited thereto. Those having ordinary skill in the art and access to the teachings provided herein will recognize additional modifications, applications, embodiments, and substitution of equivalents that all fall within the scope of the present disclosure.

Methods for Reconstructing a Motion-Compensated MR Image

MRI is a form of Nuclear Magnetic Resonance (NMR) that localizes MR signals in space to generate an image. A 2-D image can be formed by repeating the processes of Radio Frequency excitation, phase encoding, and frequency encoding many times, stepping through different values for the phase encoding gradient. A third spatial dimension may also be localized using a second phase encoding gradient to image a 3-D volume. The raw MR signals acquired during each MRI scan constitute the k-space, which is a Fourier space representing the spatial frequency information in two or three dimensions of an object. The relationship between k-space data and image data is the Fourier transformation. The position in k-space is directly related to the gradient across the object being imaged. By changing the gradient over time, the k-space data are sampled in a trajectory through the Fourier space.

Figure 1:
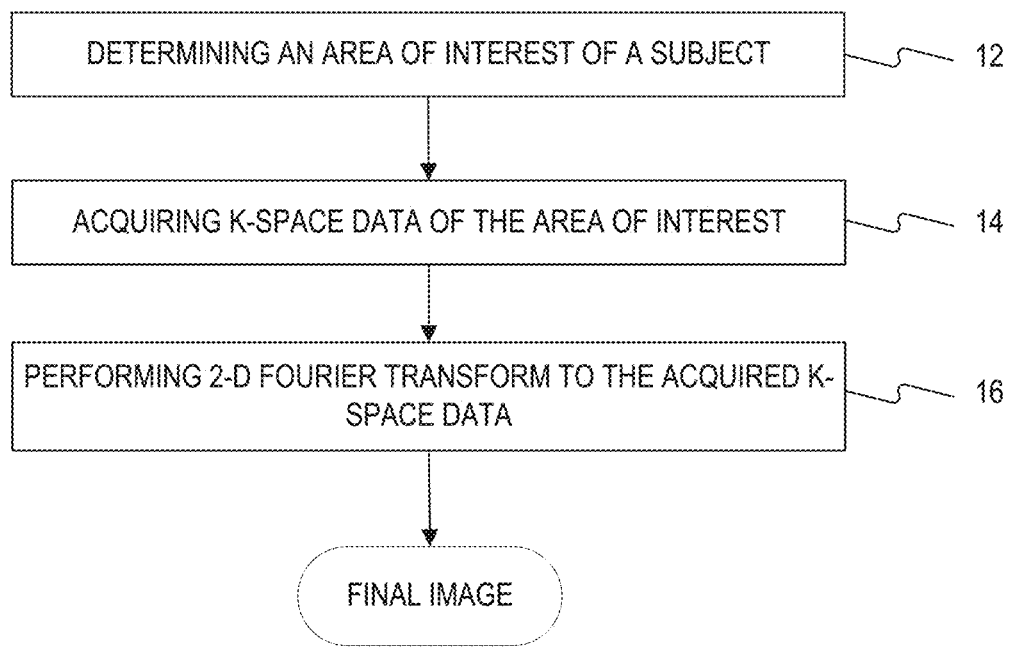
FIG. 1 illustrates an exemplary process for performing MRI of an area of interest of a subject, according to some embodiments of the present disclosure.

FIG. 1 illustrates an exemplary process 10 for performing MRI of an area of interest of a subject, in accordance with embodiments of the present disclosure. As shown in FIG. 1, the process 10 may include a plurality of steps. For example, in step 12, an area of interest of a subject is determined. In step 14, MR signals, i.e., k-space data, associated with a physiological activity in an area of interest of a subject are acquired. In step 16, an MR image can be reconstructed by performing a 2-D Fourier transform to transform the k-space data to image data. A final reconstructed MR image is then output by the process 10. Process 10 may include additional steps, such as operations for performing calibration and noise reduction.

Fast MRI

Various embodiments can be used in the context of fast MRI with reduced scan time to reduce the effect of motion artifacts on the final constructed MR image. For example, embodiments of the present disclosure may be used jointly with parallel imaging methods. In parallel imaging, MR scanners acquire MR signals or k-space data simultaneously from a plurality of independent receiver coil arrays. Each coil array is most sensitive to the magnetization closest to it and less sensitive to magnetization further away. Parallel imaging methods use the properties of the spatial sensitivity of these coil arrays to separate the aliased pixels in the image domain or to estimate missing k-space data using knowledge of nearby acquired k-space points for reconstructing the MR images. Exemplary parallel imaging methods that can be used consistent with embodiments of the present disclosure include SENSitivity Encoding (SENSE) and iterative self-consistent parallel imaging (SPIRiT).

Figure 2:
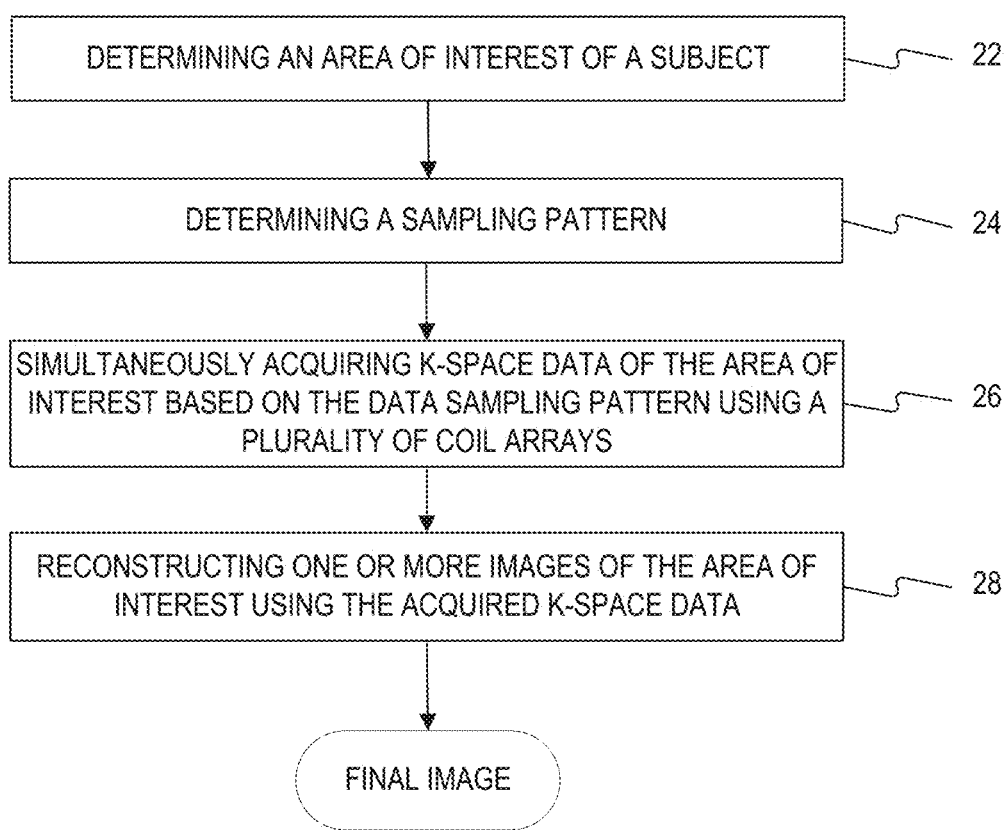
FIG. 2 illustrates an exemplary process for performing parallel imaging of an area of interest of a subject, according to some embodiments of the present disclosure.

FIG. 2 illustrates an exemplary process 20 for performing parallel imaging of an area of interest of a subject, according to embodiments of the present disclosure. As shown in FIG. 2, the process 20 may include a plurality of steps. For example, in step 22, an area of interest of a subject is determined. In step 24, a sampling pattern is determined for acquiring k-space data. The sampling pattern may be selected based on various considerations, such as the desired ranges of scan time and image resolution. In step 26, MR signals, i.e., k-space data, associated with a physiological activity in the area of interest of the subject are acquired simultaneously by the plurality of independent receiver coil arrays. In step 28, one or more MR images of the area of interest of the subject can be reconstructed using a parallel imaging method. A final reconstructed MR image can be obtained by combining the MR images for all the coil arrays, such as taking a square-root-of-sum-of-squares of the MR images for all the coil arrays.

The sampling pattern is the trajectory in which the k-space data are sampled through the Fourier space. In some embodiments, the sampling pattern can be a Cartesian trajectory where the collected k-space data points fall on a rectangular grid. In some embodiments, the sampling pattern can be a non-Cartesian trajectory where the collected k-space data points do not fall on a rectangular grid. Exemplary non-Cartesian sampling trajectories include spiral trajectories, radial trajectories, zigzag trajectories, rosette trajectories, and concentric trajectories.

In some embodiments, scan time can be further reduced by further performing undersampling, which is sampling a smaller number of data points in the sampling trajectory. For example, scan time can be further reduced by sampling a smaller number of phase encoding lines in a Cartesian trajectory, which allows acceleration into the $k_y$ direction. Scan time can further be reduced by performing undersampling in a non-Cartesian trajectory, which allows acceleration into both $k_x$ and $k_y$ directions.

In some embodiments, scan time can be reduced by performing variable-density sampling, where the sampling density is reduced in the outer portion of the k-space. Variable-density sampling uses the knowledge that most of the energy of an image is concentrated at low spatial frequencies. Therefore, by allocating more of the sampling points at and near the k-space origin, reasonable image quality can be achieved with fewer sampling points compared to the case in which k-space is sampled uniformly across the k-space.

In some embodiments, to perform variable-density sampling, the sampling density in different portions of the k-space is predetermined based on a density function—a function of the distance from the k-space origin. For example, an exemplary dual-density spiral or radial trajectory may have more number of data points per unit radial distance at an inner portion of the k-space. In such instances, the inner portion of the k-space may be sampled at a sampling density higher than that required by the Nyquist sampling theorem or at the Nyquist rate. The rest of the k-space outside the inner portion may be sampled at the Nyquist rate or less than the Nyquist rate.

In some embodiments, k-space sampling can be performed in an interleaved manner, which results in a set of interleaved k-space data. Each interleaf includes multiple data points or lines that cover different locations in k-space according to the selected sampling pattern. Each interleaf may correspond to a plurality of k-space readouts acquired sequentially in time. Such interleaved k-space sampling can be performed for different types of sampling patterns. For example, interleaved k-space sampling based on a Cartesian sampling pattern can produce a set of Cartesian interleaves, interleaved k-space sampling based on a spiral sampling pattern can produce a set of spiral interleaves, and interleaved k-space sampling based on a radial sampling pattern can produce a set of radial interleaves.

As described above, motion artifacts can distort MR images. For example, when acquiring a single image (such as a frame of a video or a frame of a time series), if the time-scale of intra-frame motion is comparable to the acquisition time for that image or frame, and if the spatial-scale of that motion is comparable to the resolution of the image or frame, that motion can introduce blur or other artifacts to the image. Similarly, during the acquisition of a k-space readout, if the image content (e.g., organs or tissue) moves (e.g., due to bulk or respiratory motions), and if the time-scale of that motion is comparable to the acquisition time for that k-space readout, the motion can result in artifacts in the MR image reconstructed based on that k-space readout.

As used herein, a motion-compensated MR image refers to a reconstructed MR image with the motion artifacts reduced or suppressed. Embodiments of the present disclosure provide for joint estimation of the motion that occurred during the k-space readouts and reconstruction of the motion-compensated MR image. This is achieved by incorporating motion estimation into the iterative process of MR image reconstruction until a desired motion-compensated MR image is obtained. Exemplary methodologies for performing the proposed joint motion estimation and MR image reconstruction are described in detail below.

The Motion Estimation Model

Most of the human body motions do not conform to rigid or affine approximations. In some embodiments, the intra-frame motion during one or more k-space readouts is modeled as a nonrigid motion or a nonrigid deformation. Modeling the intra-frame motion during one or more k-space readouts as a nonrigid motion allows more flexible and accurate approximation of the human body motion that can occur during MR scans.

In some embodiments, the intra-frame motion, modeled as nonrigid motion, is included in the forward model for reconstructing the MR image. A motion-compensated MR image can be reconstructed based on the forward model using the k-space readouts. This approach allows for addressing the effects of arbitrary motion without specific tracking of the motion during signal acquisition. Exemplary forward models and motion estimation models are explained in detail below.

As defined herein, I represents an unknown source image, the target of the reconstruction from a set of k-space data received from a MR scanner. $T(w_g)$ represents the transformation that maps the source image I to a deformed state (e.g., a corrupted image with motion artifacts), wherein $w_g$ represents a deformation vector for a pixel.

In some embodiments, the deformed state corresponds to the image reconstructed from a single k-space readout selected from the set of k-space data. In some embodiments, the set of k-space data is divided into a number of G groups of k-space readouts acquired consecutively in time. Grouping k-space readouts allows more k-space data points to be used for estimating the motion during the readouts. In such instances, the same nonrigid motion is assigned to all the k-space readouts in a given group and the deformed state corresponds to the image reconstructed from a gth group of k-space readouts.

The size of the groups of k-space data can be selected to reflect the time scale of discernable motion. For example, the group size may be selected based on the time scale of a respiratory motion. However, the number of groups cannot be too many so as to trade off data availability for minimal motion reduction.

Figure 3:
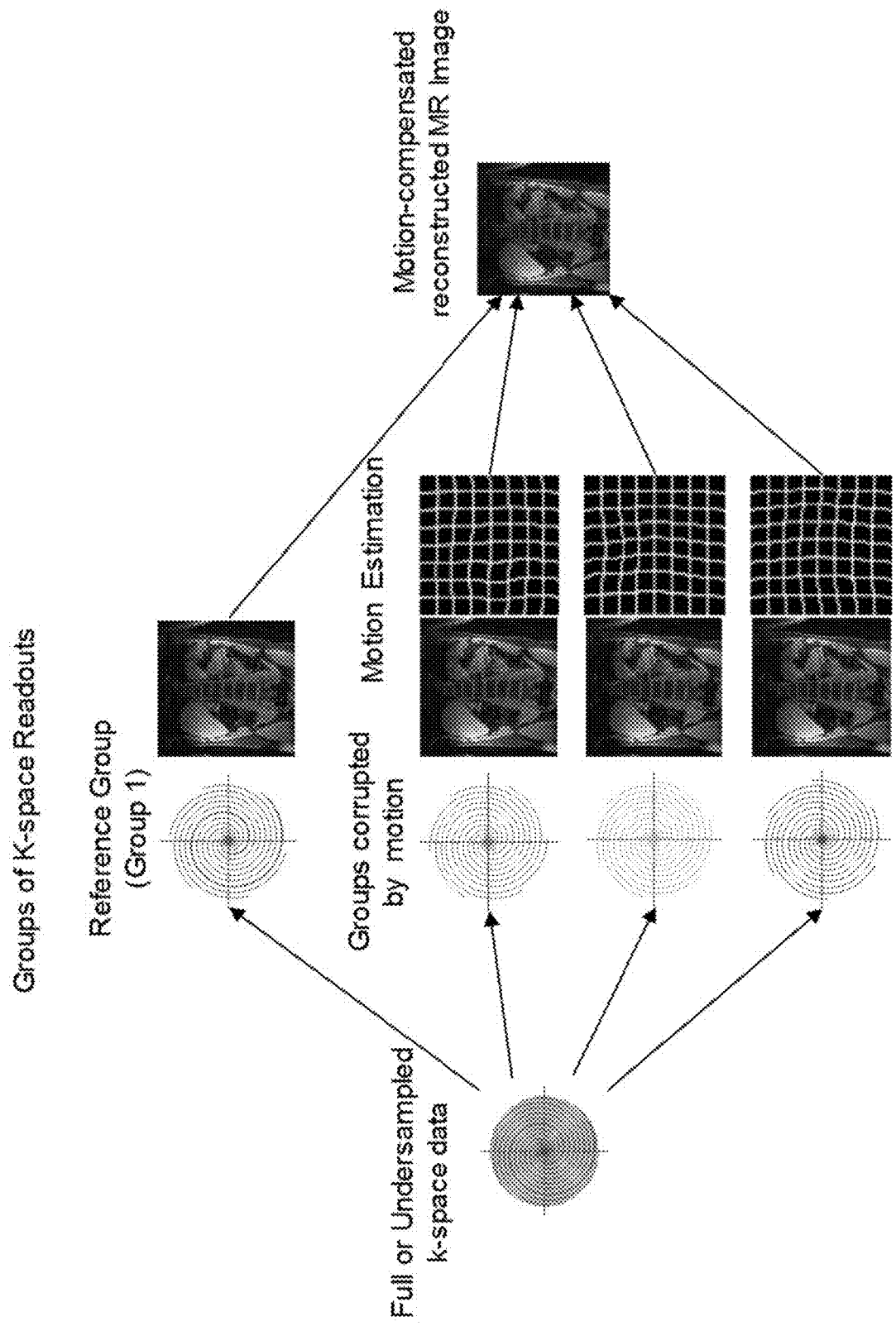
FIG. 3 illustrates an exemplary process for reconstructing a motion-compensated MR image, according to some embodiments of the present disclosure.

FIG. 3 graphically illustrates an example of the reconstruction of a motion-compensated MR image. As shown in FIG. 3, a set of k-space data is obtained and divided into G groups of k-space readouts acquired sequentially in time. The k-space data may be fully sampled or undersampled based on a selected sampling pattern, such as the spiral trajectory as shown in FIG. 3. The k-space data may be sampled in an interleaved manner. In this example, the set of k-space data is divided or interleaved into four groups, with Group 1 treated as a reference group and assumed to be consistent with the source image I to be reconstructed with no motion artifacts. Motion estimation and image reconstruction are performed jointly for each group of k-space readouts. Finally, using all the k-space data, a motion-compensated reconstructed MR image accounting for different nonrigid motions associated with groups 2-4 and consistent with the reference group is obtained. The deformed gridding shown in FIG. 3 illustrates the extension of nonrigid motion associated with each group of k-space readouts. No prior knowledge of the nonrigid motion is used in this exemplary reconstruction.

In some embodiments, b-splines are used as a model for estimating the nonrigid motion. In these instances, $T(w_g)$ corresponds to a b-spline-based local interpolation of an image onto a new grid that corresponds to adding the displacement vectors $w_g$ to the original (e.g., Cartesian) grid locations. Each displacement vector $w_g$ contains coordinate offsets in each direction, nominally on a pixel-by-pixel basis. For example, displacement of the deformation field of the gth group of k-space readouts at coordinates (x, y) can be represented by $[w_g]_x(x, y)$, and $[w_g]_y(x, y)$.

In some embodiments, to constrain the motion to be smooth, and limit the number of unknowns, b-splines on a lower-resolution grid are used to model the displacement with a reduced set of coefficients. In such instances, displacement of the deformation field of the gth group of k-space readouts at coordinates (x, y) is represented by equations (1) and (2) below.

$$[w_g]_x(x, y) = \sum_{i,j} c_{g,x}[i, j]\beta\left(\frac{x}{m_x} - i\right)\beta\left(\frac{y}{m_y} - j\right), \quad (1)$$

$$[w_g]_y(x, y) = \sum_{i,j} c_{g,y}[i, j]\beta\left(\frac{x}{m_x} - i\right)\beta\left(\frac{y}{m_y} - j\right) \quad (2)$$

where $\beta$ represent a low-resolution cubic b-spline function with stretching factors $m_x$ and $m_y$ and coefficient matrices $c_{g,x}$ and $c_{g,y}$. The scale of motion estimation or the amount of resolution reduction can be adjusted by changing these stretching factors.

As described herein, 2-D motion estimation is used in this disclosure for describing the reconstruction of 2-D motion-compensated MR images. Embodiments of the present disclosure are also applicable to joint 3-D motion estimation and reconstruction of MR images. For example, corresponding equations for estimating 3-D nonrigid motion may include three-dimensional cubic b-splines and a third set of coefficients $c_{g,z}$.

In some embodiments, the first group of k-space readouts is treated as a reference group and assumed to be consistent with the source image to be reconstructed, where $w_1$ is held to be equal to 0. Then, image reconstruction from G groups of k-space readouts would attempt to solve the following minimization problem as represented by the equation (3) below:

$$\underset{I, w_1=0, c_{2,x}, c_{2,y}, \ldots, c_{G,x}, c_{G,y}}{\operatorname{argmin}} \sum_{g=1}^{G} \|m_g - F_g T(w_g(c_{g,x}, c_{g,y}))I\|^2 \quad (3)$$

where the matrix Fg represents the Cartesian or non-Cartesian Fourier transform, subsampled to produce the k-space values corresponding to the data points of the k-space readouts of the gth group. Various computational method may be used to solve the minimization problem represented by the equation (3). For example, the minimization problem may be solved by a nonlinear conjugate gradient method.

Regularization

The reconstruction as represented by equation (3) can be ill-posed because the deformation coefficients are not constrained, and the entire set of k-space data may be insufficient to specify a unique image on its own. Embodiments of the present disclosure address this issue by adding one or more regularization terms in the forward model as described in detail below.

In some embodiments, the regularization terms may constrain the deformation coefficients. Such regularization terms may constrain the extent of the estimated motion or enforce smoothness of the deformation field. In some embodiments, the regularization terms may impose constraints based on the MR imaging modality. For example, when used with SPIRiT, the regularization terms may impose a null space constraint in either the image domain or frequency domain.

In some embodiments, the regularization term for constraining the deformation coefficients is a penalty term added to the forward model. In some embodiments, the penalty term constrains the b-spline-coefficient-based finite differences approximation to the Jacobian matrix (first-order partial derivatives) of the deformation vector field. This penalty is piecewise-smooth, and limits motion changes that would violate invertibility or produce extreme changes in the volumes of local structures (as reflected by the determinant of the Jacobian matrix). In some embodiments, the penalty term is represented by a semi-quadratic function, similar to the penalty function as described by S. Y. Chun et al. in "A Simple Regularizer for B-spline Nonrigid Image Registration That Encourages Local Invertibility," *IEEE Journal of Selected Topics in Signal Processing*, 3(1), pp. 159-169 (2009), which is incorporated by reference in its entirety. In these embodiments, first-order backward difference-based approximations for the x- and y-derivatives of the x- and y-displacement coefficients are represented by the equation (4) below. The penalty function is represented by the equation (5) below.

$$p_{g,xx}[i,j] \approx \frac{\partial c_{g,x}[i,j]}{\partial x}, \quad (4)$$

$$p_{g,xy}[i,j] \approx \frac{\partial c_{g,y}[i,j]}{\partial x},$$

$$p_{g,yx}[i,j] \approx \frac{\partial c_{g,x}[i,j]}{\partial y},$$

$$p_{g,yy}[i,j] \approx \frac{\partial c_{g,y}[i,j]}{\partial y}$$

$$\phi(p) = \begin{cases} \frac{1}{2}(p-\tau_1)^2, & p \leq \tau_1, \\ 0, & \tau_1 < p \leq \tau_2, \\ \frac{1}{2}(p-\tau_2)^2, & p > \tau_2. \end{cases} \quad (5)$$

The piecewise-smooth penalty function as represented above imposes a practical constraint that the change in motion from one location to the next is neither so small (negative) nor so large (positive) such that one pixel would not move too close to a neighbor. Values of $\tau_1$ and $\tau_2$ can be derived according to the formula provided in S. Y. Chun et al., "A Simple Regularizer for B-spline Nonrigid Image Registration That Encourages Local Invertibility," *IEEE Journal of Selected Topics in Signal Processing*, 3(1), pp. 159-169 (2009), which is incorporated by reference in its entirety. In some embodiments, for $p_{xx}$ and $p_{yy}$, small values are used for $\tau_1$ and larger values are used for $\tau_2$. For example, small values of $\tau_1$, where $\tau_1 < 0$ and much larger values of $\tau_2$, where $\tau_2 >> -\tau_1$ can be used. In some embodiments, for $p_{xy}$ and $p_{yx}$, small values are used for $\tau_1$ and $\tau_2$, where $\tau_1 = -\tau_2$. In some embodiments, for $p_{xx}$ and $p_{yy}$, $\tau_1 = -m_x(1-0.01)/2$, $\tau_2 = m_x\sqrt{(100)}-1$. In some embodiments, for $p_{xy}$ and $p_{yx}$, $\tau_1 = -\tau_2 = -m_x(1-0.01)/2$. The selection of values for $\tau_1$ and $\tau_2$ may permit small decreases in volume and larger increases in volume. In some embodiments, values of $\tau_1$ and $\tau_2$ are selected such that decreases in volume are constrained more aggressively. This is because significant decreases in volume may lead to ill-conditioning or even non-invertibility of the deformation.

As described herein, the penalty function can be generalized for 3-D motion estimation. In such instances, 3×3 matrix of partial derivatives for each direction and each displacement is used in the penalty function.

In some embodiments, the motion-regularized form of the motion-compensated reconstruction is represented by the equation (6) below.

$$\operatorname*{argmin}_{I, w_1=0, c_{2,x}, c_{2,y} \ldots c_{G,x}, c_{G,y}} \sum_{g=1}^{G} \|m_g - F_g T(w_g(c_{g,x}, c_{g,y}))I\|^2 + \qquad (6)$$

$$\lambda_1 \sum_{g,i,j} \phi(p_{g,xy}[i,j]) + \phi(p_{g,yx}[i,j]) + \phi(p_{g,yy}[i,j]).$$

where the deformations $w_g$ and partial derivatives $p_{g,xx}$, $p_{g,xy}$, $p_{g,yx}$, and $p_{g,yy}$ are linear functions of $c_{g,x}$ or $c_{g,y}$, and $\lambda_1$ is a regularization tuning parameter that trades data-consistency for this motion constraint. In some embodiments, the value of $\lambda_1$ is equal to 20. The flat part of the penalty function (equation (5)) imposes a limit that setting $\lambda_1$ too large does not change the motion estimates too much. For example, in some embodiments, $\lambda_1$ may be equal to 100 or another suitable value selected based on the acquired k-space dataset.

In some embodiments, joint motion estimation and MR image reconstruction can be performed based on undersampled k-space data acquired in fast MM, such as undersampled k-space data acquired in parallel imaging. In such instances, the regularization terms may include a penalty term corresponding to the MR imaging modality. The MR image reconstruction from G groups of k-space readouts would then solve the following minimization problem as represented by the equation (7) below:

$$\operatorname*{argmin}_{I, w_1=0, c_{2,x}, c_{2,y} \ldots c_{G,x}, c_{G,y}} \sum_{g=1}^{G} \|m_g - F_g T(w_g(c_{g,x}, c_{g,y}))I\|_F^2 + \qquad (7)$$

$$\lambda_2 \|\text{PARALLEL IMAGING}(I) - I\|_F^2 + \lambda_1 \sum_{g,i,j} \phi(p_{g,xx}[i,j]) +$$

$$\phi(p_{g,xy}[i,j]) + \phi(p_{g,yx}[i,j]) + \phi(p_{g,yy}[i,j]).$$

where the k-space readout groups $m_g$ and image set I are matrices, with each column representing a different coil channel, and the Frobenius norm $\|\cdot\|_F$ replaces the vector 2-norm, $\lambda_2\|\text{PARALLEL IMAGING}(I)-I\|_F^2$ represents a quadratic penalty term imposing the constraint required by the parallel imaging method, and $\lambda_2$ is a tuning parameter.

For example, in SPIRiT parallel imaging, the linear relationship between adjacent k-space frequencies across coils yields a null space constraint in either the image domain or frequency domain as described by M. Lustig et al. in "SPIRiT: Iterative self-consistent parallel imaging reconstruction from arbitrary k-space," *Magnetic Resonance in Medicine*, 64(2), pp. 457-471 (2010), which is incorporated herein by reference in its entirety. Adding to the minimization problem a quadratic penalty on the difference between the set of coil images and the per-pixel SPIRiT combination of that set minimizes violation of this null space constraint. Therefore, the SPIRiT parallel imaging-regularized image reconstruction is represented by the equation (8) below:

$$\operatorname*{argmin}_{I, w_1=0, c_{2,x}, c_{2,y} \cdots, c_{G,x}, c_{G,y}} \sum_{g=1}^{G} \|m_g - F_g T(w_g(c_{g,x}, c_{g,y}))I\|_F^2 + \qquad (8)$$
$$\lambda_2 \|\text{SPIRiT}(I) - I\|_F^2 + \lambda_1 \sum_{g,i,j} \phi(p_{g,xx}[i,j]) +$$
$$\phi(p_{g,xy}[i,j]) + \phi(p_{g,yx}[i,j]) + \phi(p_{g,yy}[i,j]).$$

where $\lambda_2$ is selected to be equal to 1 as in conventional SPIRiT.

As described herein, other forms of regularization can be added to the minimization problem described above. Such regularization may be added in the form of one or more quadratic or semi-quadratic functions suitable for the acquired k-space data set.

Figure 4:
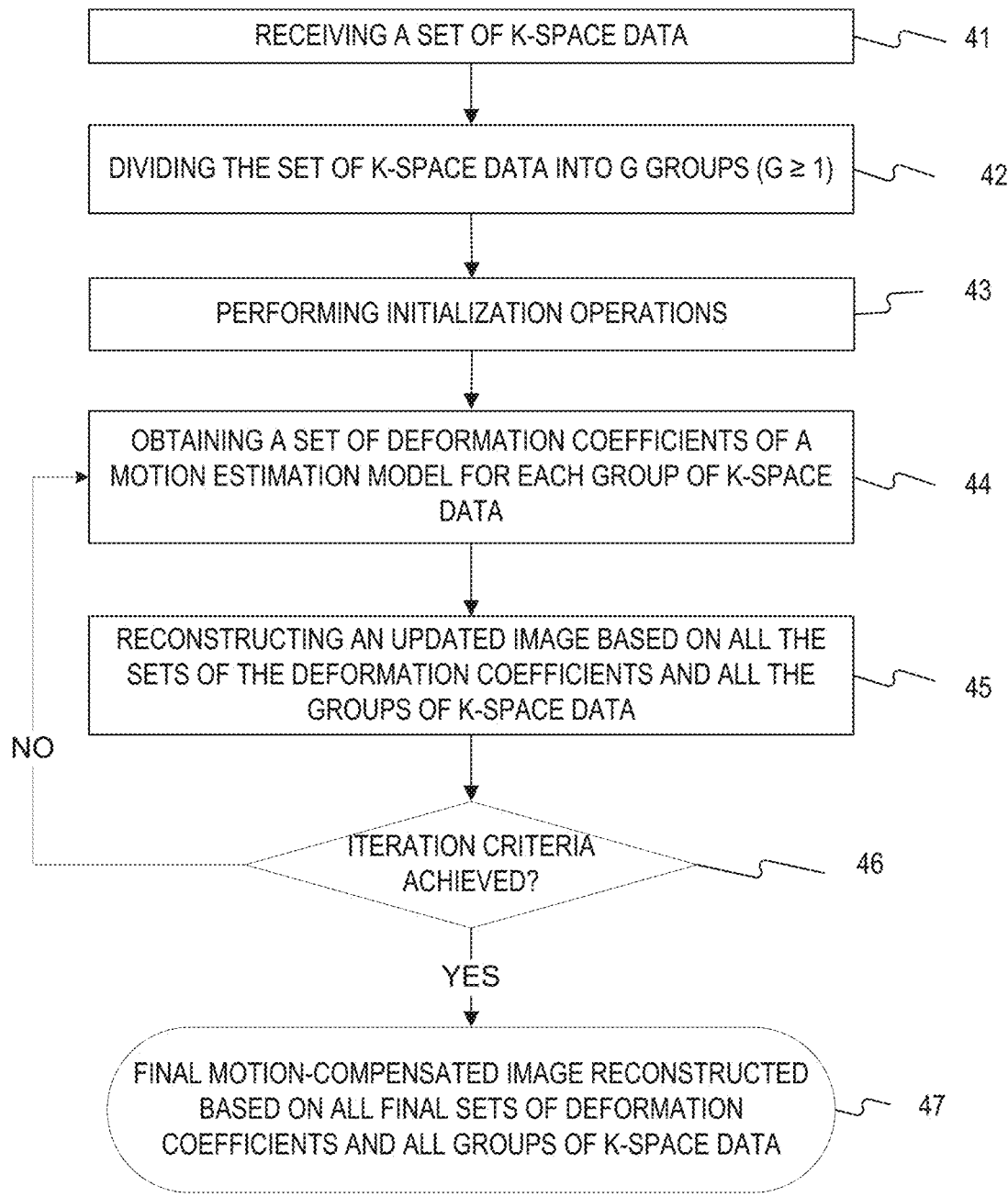
FIG. 4 illustrates joint motion estimation and reconstruction of an MR image, according to some embodiments of the present disclosure.

FIG. 4 illustrates an exemplary process 40 for performing motion-compensated image reconstruction, in accordance with embodiments of the present disclosure. As shown in FIG. 4, process 40 may include steps 41-47. For example, in step 41, a set of k-space data is received. In some embodiments, the set of k-space data may be obtained simultaneously by a plurality of coil arrays. In some embodiments, the set of k-space data may be sampled in an interleaved manner based on a selected sampling pattern, such as a spiral or radial trajectory. In step 42, the set of k-space data is divided into a number of G groups. The group size may be selected based on the time scale of a respiratory motion, the time required for obtaining a k-space readout, and/or the number of data points in each k-space readout.

As shown in FIG. 4, in step 43, a plurality of initialization operations are performed. In some embodiments, the initialization operations include designating a reference group of k-space data. For example, the initialization operations may include designating the first group of k-space data as the reference group and initializing motion for the first group of k-space data to zero. In some embodiments, the initialization operations may further include performing Fourier Transform using the first group of k-space data to obtain an initial coarse image. In other embodiments, one or more iterations of a parallel imaging method using the first group of k-space data are performed to obtain an initial coarse image. The initial coarse image is then used as the input to solve the minimization problem represented by one of the equations (3), (6), (7), and (8).

In some embodiments, as shown in FIG. 4, the minimization problem is solved by an iterative process including steps 44, 45, and 46. In some embodiments, the iterative process may use a nonlinear conjugate gradient method. The iterative process may alternate minimization to jointly estimate nonrigid motion and perform image reconstruction for each group of k-space data until an iteration criteria is achieved. For example, in step 44, a set of deformation coefficients of the motion estimation model represented by equations (1) and (2) for each group of k-space data is obtained as a solution of the minimization problem. In step 45, an updated image is reconstructed as a solution of the minimization problem using all the sets of the deformation coefficients obtained in the previous step 44 and all the groups of the set of k-space data.

Steps 44 and 45 are repeated until predetermined iteration criteria are achieved, which is determined in step 46. In step 46, when it is determined that the predetermined iteration criteria are not achieved, the output of step 45, that is the updated image reconstructed in step 45, is then provided as the input for step 44 of the next iteration. In step 44 of the next iteration, the minimization problem is solved again to obtain an updated set of deformation coefficients of the motion estimation model for each group of k-space data. Then, step 45 is repeated again. If in step 46, it is determined that the predetermined iteration criteria are achieved, the last updated image reconstructed in step 45 is output as the final motion-compensated image in step 47.

In step 46, the iteration criteria may include one or more stopping criteria. In some embodiments, a desired number of alternating iterations is used as a stopping criteria. Steps 44 and 45 may be repeated until the number of alternating iterations reaches the desired value. In some embodiments, when a nonlinear conjugate gradient method is used, a threshold for the change in the value of the objective function (e.g., equation (3), (6), (7), or (8)) may be used as a stopping criterion. Steps 44 and 45 may be repeated until the change in the value of the objective function is smaller than the threshold. In some embodiments, a threshold for the change in the motion coefficients may be used as a stopping criterion. Steps 44 and 45 may be repeated until the change in the motion coefficients is smaller than the threshold. In some embodiments, a threshold for the change in the values of the reconstructed image may be used as a stopping criterion. Steps 44 and 45 may be repeated until the change in the values of the reconstructed image is smaller than the threshold.

Joint Multi-Scale Motion Estimation and Image Reconstruction

Figure 5:
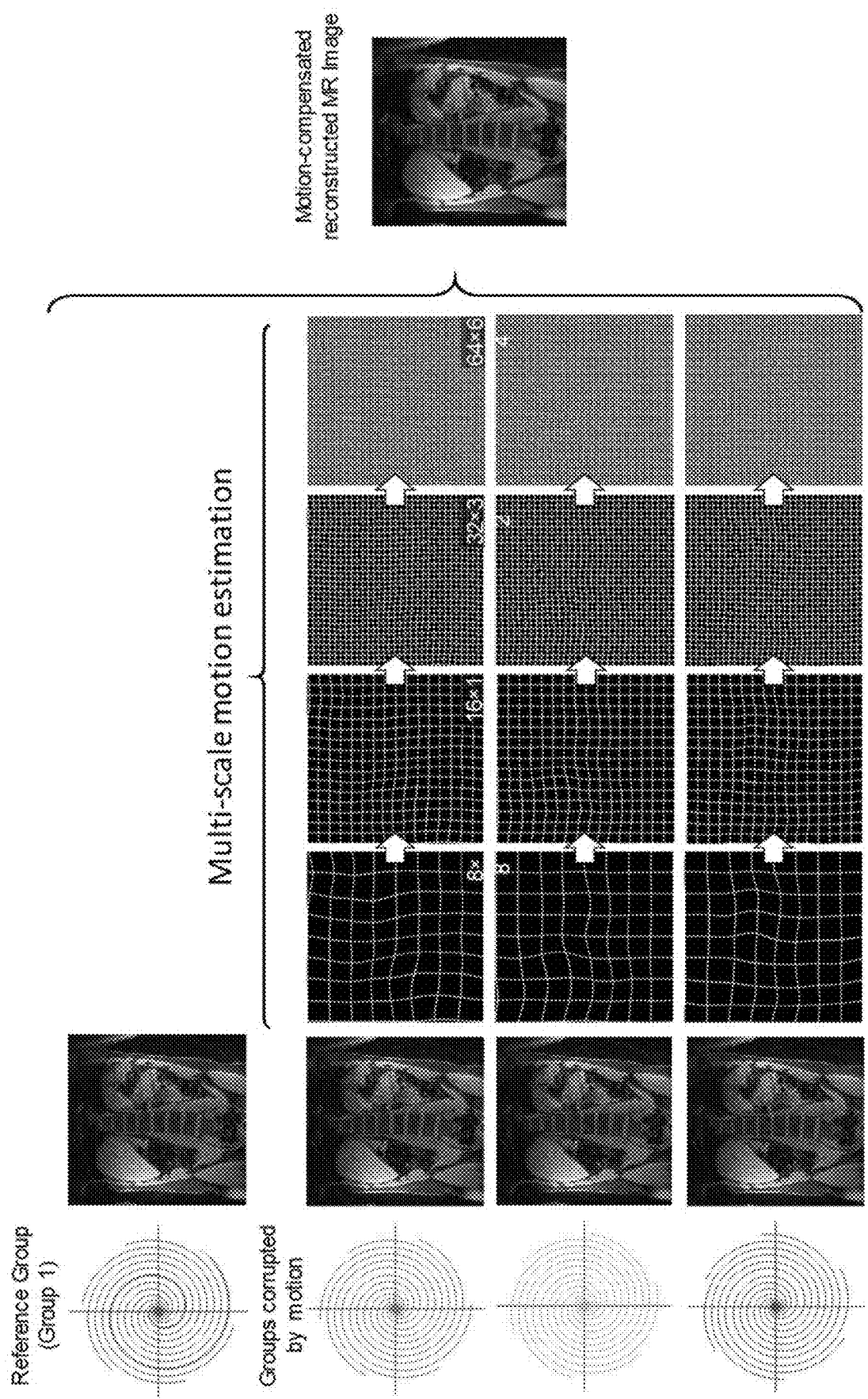
FIG. 5 illustrates an exemplary joint four-scale motion estimation and reconstruction of an MR image, according to some embodiments of the present disclosure.

In some embodiments, multi-scale motion estimation is jointly performed with MR image reconstruction. In such embodiments, motion estimation is performed from the coarsest scale to the finest scale for each group of k-space data. FIG. 5 illustrates an exemplary joint four-scale motion estimation and image reconstruction performed for a set of k-space data divided into four groups. Group 1 of the k-space data is treated as the reference group. As shown in FIG. 5, the motion estimation starts at the coarsest scale successively to the finest scale. The coarsest scale corresponds to the lowest resolution of motion estimation while the finest scale corresponds to the highest resolution of motion estimation.

In some embodiments, joint multi-scale motion estimation and MR image reconstruction are advantageously performed for k-space data set sampled according to a variable density sampling pattern. As described above, variable-density sampling can be performed to accelerate MR scans. In variable-density sampling, the sampling density is reduced in the outer portion of the k-space representing higher frequencies as compared to that in the inner portion of the k-space representing lower frequencies. In the context of parallel imaging, higher frequencies in the k-space are undersampled more than the lower frequencies at and/or near the origin of k-space.

In some embodiments, variable sampling is realized with non-Cartesian sampling patterns, such as spiral or radial trajectories. Such non-Cartesian sampling patterns allow for repeated sampling at and/or near the origin of k-space, where most of the energy of an image is concentrated. The greater sampling density at and/or near the origin of k-space reduces aliasing energy in low-resolution images, thereby increasing the accuracy of the reconstructed initial coarse image and the accuracy of motion estimation at the coarse scale. The increased accuracy of the initial coarse image and the increased accuracy of motion estimation at the coarse scale in turn increase the accuracy of the final estimated motion and reconstructed MR image.

Figure 6:
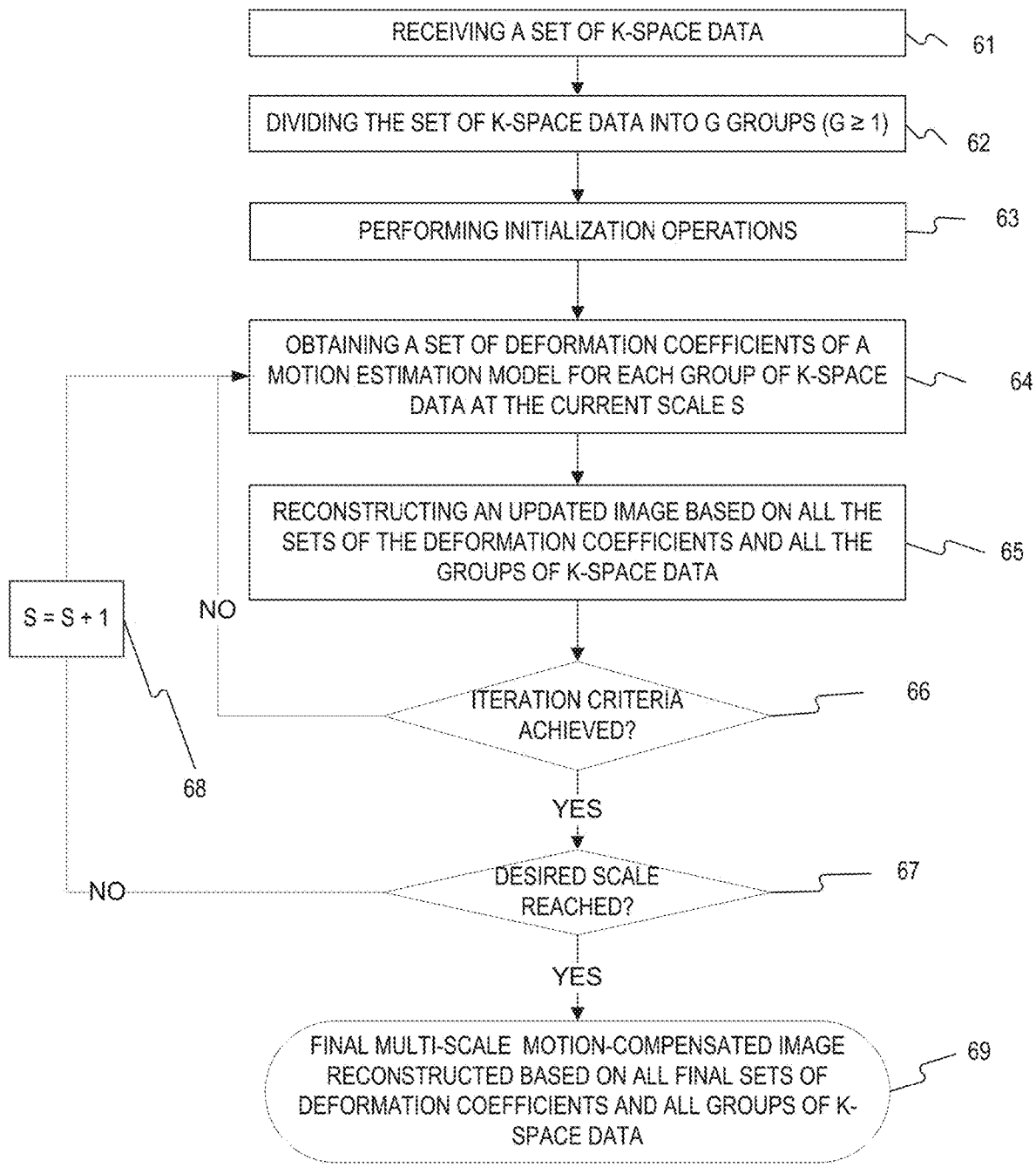
FIG. 6 is a flowchart illustrating an exemplary process for performing multi-scale motion-compensated reconstruction of an MR image, according to some embodiments of the present disclosure.

FIG. 6 illustrates an exemplary process 60 for performing multi-scale motion-compensated image reconstruction, in accordance with embodiments of the present disclosure. As shown in FIG. 6, process 60 may include steps 61-69. For example, in step 61, a set of k-space data is received. In some embodiments, the set of k-space data may be obtained simultaneously by a plurality of coil arrays. In some embodiments, the set of k-space data may be sampled in accordance with a selected sampling pattern, such as a spiral or radial trajectory. In some embodiments, the set of k-space data may be sampled in accordance with a variable density sampling pattern. In some embodiments, the set of k-space data is sampled based on a variable density spiral trajectory or variable density radial trajectory. For example, the set of k-space data is sampled based on a dual density spiral trajectory or dual density radial trajectory.

In some embodiments, similar to step 42 in process 40, in step 62, the set of k-space data is divided or interleaved into a number of G groups. The group size may be selected based on the time scale of a respiratory motion, the time required for obtaining a k-space readout, and/or the number of data points in each k-space readout.

In step 63, a plurality of initialization operations are performed. In some embodiments, the initialization operations include designating a reference group of k-space data. For example, the initialization operations may include designating the first group of k-space data as the reference group and initializing motion for the first group of k-space data to zero. In some embodiments, the initialization operations include reconstructing an initial coarse image using the first group of k-space data. For example, a single SPIRiT iteration (multi-channel) or a non-iterative density-compensated gridded reconstruction (single-channel) is performed to produce an initial coarse image. The initial coarse image may have some aliasing artifacts. The initial coarse image is then used as the initial input to the following steps to solve the minimization problem represented by one of the equations (3), (6), (7), and (8).

In some embodiments, the initialization operations include setting an initial scale s of motion estimation. For example, the initialization operations include setting the initial scale s of motion estimation to one. As described herein, to perform multi-scale motion estimation, a set of deformation coefficients $\{c_{g,x}^{(s)}[i,j], c_{g,y}^{(s)}[i,j]: \forall i,j\}$ of the motion estimation model represented by equations (1) and (2) is estimated for each scale s. The scale s is then varied from the initial coarsest scale in the coarse-to-fine order, and the number of coefficients is increased in each successive scale level. At the lowest resolution or the coarsest scale of motion estimation, the fewest motion coefficients of the motion estimation model are obtained. At this scale, the largest stretching factors $m_x$ and $m_y$ are used. Then, after the estimation of the coarse-scale motion (and the corresponding reconstructed image) has stabilized, the resolution of motion estimation is increased by a predetermined factor. In some embodiments, the resolution of motion estimation for the next finer scale s+1 is increased by a factor of two. In such instances, the stretching factors $m_x$ and $m_y$ are divided by two, and the number of motion coefficients are doubled for each group of k-space data. For example, $m_x$ and $m_y$ may start at 32 at the initial coarse scale, and then decreased to 16, 8, and 4 for the success three scale levels.

The multi-scale motion estimation is performed jointly with MR image reconstruction via two iterative processes as described in detail below with reference to steps 64-69. The first iterative process includes steps 64-66. The second iterative process incorporates the first iterative process and steps 67 and 68.

As shown in FIG. 6, in the first iterative process, in step 64, a set of deformation coefficients of the motion estimation model for each group of k-space data at the current scale s is obtained. For example, the set of deformation coefficients $\{c_{g,x}^{(s)}[i,j], c_{g,y}^{(s)}[i,j]: \forall i,j\}$ of the motion estimation model represented by equations (1) and (2) at the current scale s is obtained as the solution of the minimization problem as represented by one of the equations (3), (6), (7), and (8). In step 65, an updated image is reconstructed as a solution of the same minimization problem using all the sets of the deformation coefficients for all the groups of k-space data obtained in the previous step 44 and all the groups of the set of k-space data.

Steps 64 and 65 are repeated until a predetermined iteration criteria is achieved, which is determined in step 66. In step 66, when it is determined that the predetermined iteration criteria are not achieved, the output of step 65, that is the updated image reconstructed in step 65, is then provided as the input for step 64 in the next iteration of the first iterative process. In step 64 in the next iteration, the minimization problem is solved again to obtain an updated set of deformation coefficients of the motion estimation model for each group of k-space data at the current scale s. Then, step 65 is performed again using the updated set of deformation coefficients from step 64. If in step 66, it is determined that the predetermined iteration criteria are achieved, process 60 moves to step 67. Exemplary iteration criteria used by step 46 can be similarly used by step 66.

As described herein, various computational methods may be used to solve the minimization problem in steps 64 and 65. In some embodiments, in step 64 or in step 65, the minimization problem may be solved using the Newton's method, the Gauss-Newton method, or the Levenberg-Marquardt method. In some embodiments, in step 64 or in step 65, the minimization problem may be solved by a nonlinear conjugate gradient method. Various approaches may be used for setting the "step size" and for updating the "conjugate direction" of the nonlinear conjugate gradient method. For example, the nonlinear conjugate gradient method may use a second-order Newton step size, use the backtracking line-search for satisfying the "Wolfe conditions," or use a step size based on the Lipschitz constant for the current polynomial approximation of the function at the current iterator. To update the "conjugate direction," a suitable formula may be used, such as the Polak-Ribière formula, the Fletcher-Reeves formula, or the Hestenes-Stiefel formula. In some embodiments, in step 65, in the context of parallel imaging, such as SPIRiT, the minimization problem may be solved using the LSQR method.

In some embodiments, in step 67, it is determined whether the desired scale of motion estimation has been reached. When it is determined that the desired scale of motion estimation has not been reached, process 60 moves to step 68 where the current scale of motion estimation is updated to a finer scale s+1, and the last updated image of step 65 is used as the initial input of step 64 in the next iteration of the first iterative process to estimate the set of deformation coefficients of the motion estimation model for the finer scale s+1. The first iterative process is repeated until in step

67, it is determined that the desired scale of motion estimation has been reached. Then, the last updated image reconstructed in step 65 is output as the final multi-scale motion-compensated reconstructed image in step 69.

As described above, in step 64, process 60 initializes the first iterative process using the updated image from step 65 of the previous iteration (image resolution does not change). In some embodiments, in step 64, a set of higher-resolution deformation coefficients for each group of k-space data is interpolated using cubic b-splines obtained from the lower-resolution result of the iteration. Increasing the resolution of just the deformation coefficient sets allows for the initial stages to better capture the nonrigid motion, such as the bulk motion of the subject and the organs, while the later stages may refine motion estimates on the boundaries of different local motion areas.

In some embodiments, in the context of parallel imaging, process 60 further includes a step that combines the reconstructed motion-compensated MR images for the different coil arrays into one image. For example, the final reconstructed motion-compensated MR image can be obtained by taking a square-root-of-sum-of-squares of the reconstructed motion-compensated MR images for all the coil arrays.

Advantageously, process 60 can be used for jointly performing multi-scale motion estimation and image reconstruction using k-space data sampled based on variable density non-Cartesian trajectories used for accelerated MR imaging techniques, providing for further reducing or suppressing motion artifacts in fast MRI.

Experimental Results

Experiments were performed to (1) ascertain the effect or quality of multi-scale motion estimation methods consistent with the present disclosure, (2) compare the motion-compensated reconstructions of abdominal MR images against reconstructions using existing motion-correcting reconstruction techniques (e.g., nonrigid autofocus with locally linear translations), and (3) demonstrate the application of embodiments of the present disclosure to the estimation of real motion.

To accomplish these objectives, the experiments used breath-held and free-breathing pilot data sets acquired from consented human subjects under a protocol approved by the Institutional Review Board of the University of Virginia (protocol #17557). All reconstructions were evaluated via visual comparison. The multi-scale motion-compensated reconstructions from the breath-held data with synthetic motion added retrospectively were also evaluated according to the peak signal to error ratio (PSER) and the structural similarity (SSIM) index perceptual quality metric as described by Zhou Wang, et al. in the article "Image quality assessment: from error visibility to structural similarity," *IEEE Transactions on Image Processing,* 13(4), pp. 600-612 (2004), which is incorporated by references in its entirety.

K-Space Data Sets

The k-space data sets were acquired on a Siemens Avanto 1.5T scanner using a T1-weighted gradient echo (VIBE) pulse sequence with a 3-D stack of spirals k-space trajectory. The original acquisition prescribed 20 kz partitions. After taking an inverse Fourier transform in the z-direction, the extreme two slices on both ends were removed to mitigate wrap-around aliasing unrelated to motion, resulting in 16 coronal slices, each 5 mm thick. For each kz-partition, the acquired data contains N=74 spiral interleaves from 12 coil channels (of a Siemens spine and body array coil) with a nominal field of view (FOV) of 400×400 mm and a base resolution of 1.56×1.56 mm. These dual density interleaves were acquired with a 1/FOV spacing at the center of k-space and N/FOV spacing for the outer part per interleaf. For these data sets, the data were acquired in 30 seconds (a single breath hold for the breath-held scans). Two additional interleaves were acquired for each kz partition to support automatic off-resonance correction. The same scan prescription was used for both the breath-held and free-breathing (real motion) acquisitions.

From a breath-held ground truth data set, synthetic motion was introduced and the k-space was resampled along the same readout pattern. Different synthetic motion for each ¼ of k-space was introduced, yielding a blurred reconstruction without motion correction. To form this synthetic motion, and to avoid the "inverse crime" of using the motion estimation model to synthesize the motion, high-resolution, smooth distortions on a voxel-wise basis were created around the locations of internal organs like the liver and kidneys that are known to move in free-breathing and pediatric patient imaging. The free-breathing data had their own real motion and did not have any additional motion added.

Evaluation Criteria

For the data incorporating known synthetic motion, direct comparison of the reconstructed image to a motion-free ground truth was made. Given the ground truth, we compare image quality using the peak signal to error ratio (PSER) defined as $$PSER = 20\log_{10}\frac{\sqrt{N} \cdot \|x_{true}\|_\infty}{\|x - x_{true}\|_2}$$

and the structural similarity index (SSIM). This second measure is sensitive to image sharpness, which is the criterion measured by gradient entropy for competing methods like autofocus navigation as described by Y. Cheng, et al. in "Nonrigid motion correction in 3D using autofocusing with localized linear translations," *Magnetic Resonance in Medicine,* 68(6), pp. 1785-1797 (2012), which is incorporated herein by reference in its entirety. Reconstructions with either synthetic or real motion were also compared visually.

Results

The first experiment concerns the validation of the multi-scale motion estimation on synthetic (or simulated) nonrigid motion. This first experiment compares motion estimation and image reconstructions with and without the multi-scale motion estimation. A set of k-space data 2×-undersampled according to a dual density spiral trajectory was corrupted by synthetic motion and divided into four groups. Both single-scale (no multi-scale) motion estimation as described above with respect to FIG. 4 and multi-scale motion estimation as described above with respect to FIG. 6 were performed to estimate the nonrigid motion introduced to the sampled k-space data. The difference between the reconstructed images and the reference (uncorrupted) image were then compared.

Figure 7:
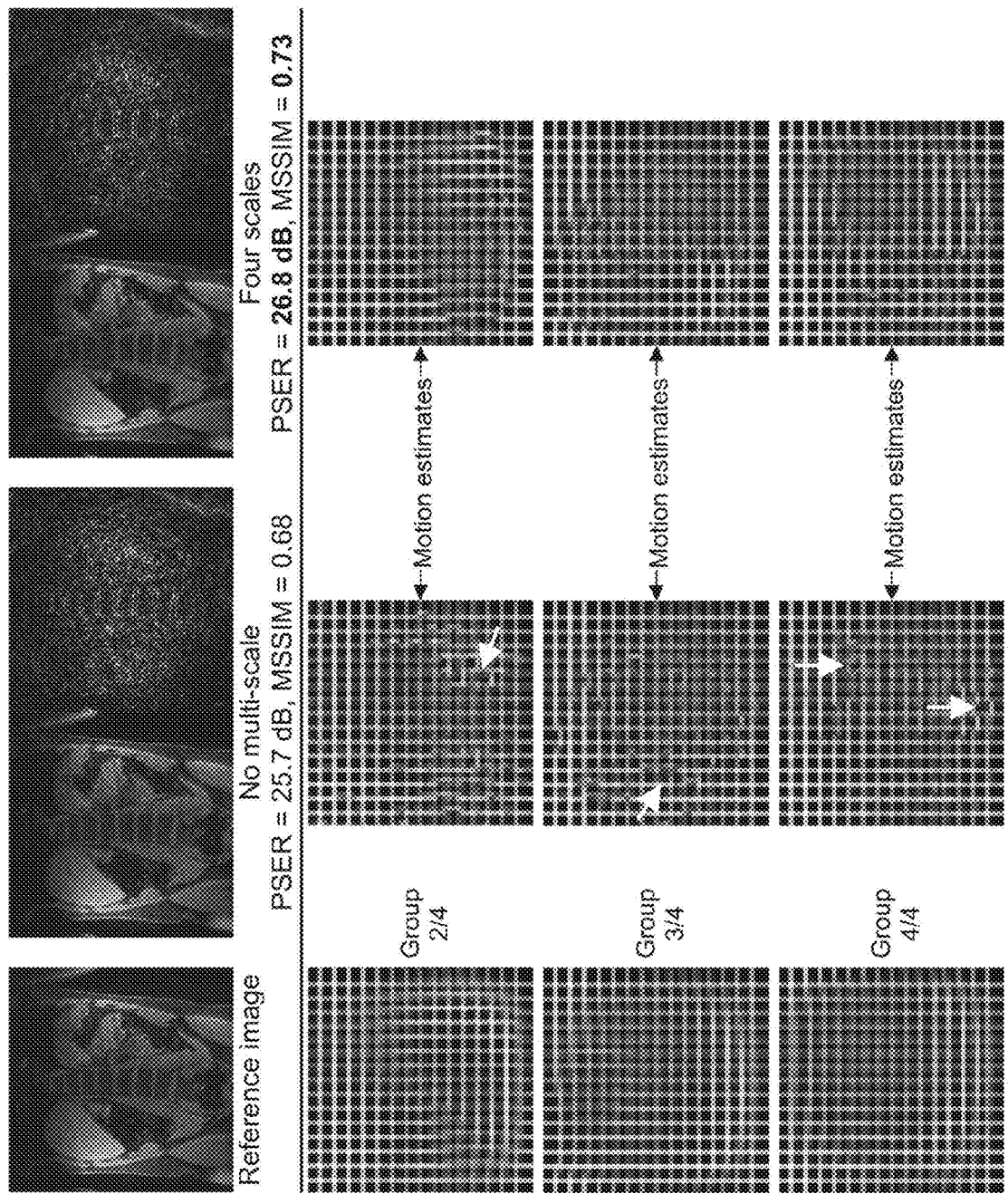
FIG. 7 compares the original image and MR images reconstructed according to some embodiments of the present disclosure.

FIG. 7 shows the original image (reference image) and the images reconstructed jointly with single-scale (no multi-scale) motion estimation or four-scale motion estimation. As shown in FIG. 7, a 256×256 pixel reference image (top-left) was perturbed by four groups of simulated motion during acquisition (group 1 is the reference, assumed to have zero motion). Both single-scale and multi-scale motion estimation methods found mappings from the original image to the transformed data for each group of k-space data. In the top part of FIG. 7, the final reconstructed image and difference image without multi-scale motion estimation shows more artifacts than the reconstructed image with four levels of motion estimation. The motion estimates for groups 2-4 are shown below the reconstructed images. The white arrows (in the middle column) indicate spurious errors in the motion estimates generated without multi-scale motion estimation.

As shown in FIG. 7, the multi-scale motion estimation captures bulk motion at the coarsest scale, and it provides a mostly accurate estimate of the motion at the fine scale. The single-scale (no multi-scale) motion estimation produces small motion errors throughout the imaging plane. The four-scale motion estimates are much smoother and more consistent with the true deformations. The largest errors in the reconstructed image are present around the lumbar vertebrae. The area around the liver and outer wall of the body have relatively small errors. Details like the venous structure of the liver have little error as well.

The second experiment compares multi-scale motion compensated reconstruction proposed by the present disclosure to an existing autofocus method described in Y. Cheng, et al., "Nonrigid motion correction in 3D using autofocusing with localized linear translations," *Magnetic Resonance in Medicine,* 68(6), pp. 1785-1797 (2012), which is incorporated herein by reference in its entirety. The existing autofocus method is a nonrigid motion correction method that relies on navigator data.

The second experiment again used simulated motion with a ground truth. The existing autofocus method uses parallel imaging to approximate nonrigid motion with locally linear translations. This approximation is consistent with a low-resolution deformation field. To reproduce images from incomplete measurements, both the existing autofocus method and the proposed multi-scale motion-compensated reconstruction were combined with SPIRiT reconstruction. As the multi-scale motion estimation does not require navigators to measure in-plane motion, similar or improved performance on undersampled k-space data helps justify the use of the proposed multi-scale motion-compensated reconstruction for nonrigid motion correction.

In this second experiment, a fully sampled set of k-space data was obtained. The set of k-space data included interleaved 74 readouts/kz, partitioned into four groups, three of which were corrupted by motion. A direct SPIRiT reconstruction was employed, yielding a highly blurred image with significant motion-amplified aliasing artifacts. Then, the image was reconstructed by alternating multi-scale motion estimation and SPIRiT reconstruction, consistent with the embodiments as described above with respect to FIG. 6. For the autofocus method, both $k_x$ and $k_y$ butterfly navigators in k-space were synthesized and nonrigid groupwise autofocus reconstruction was employed, with and without SPIRiT parallel imaging, for comparison. These reconstructions were performed for two of the 16 slices and respectively shown in FIGS. 8 and 9.

Figure 8:
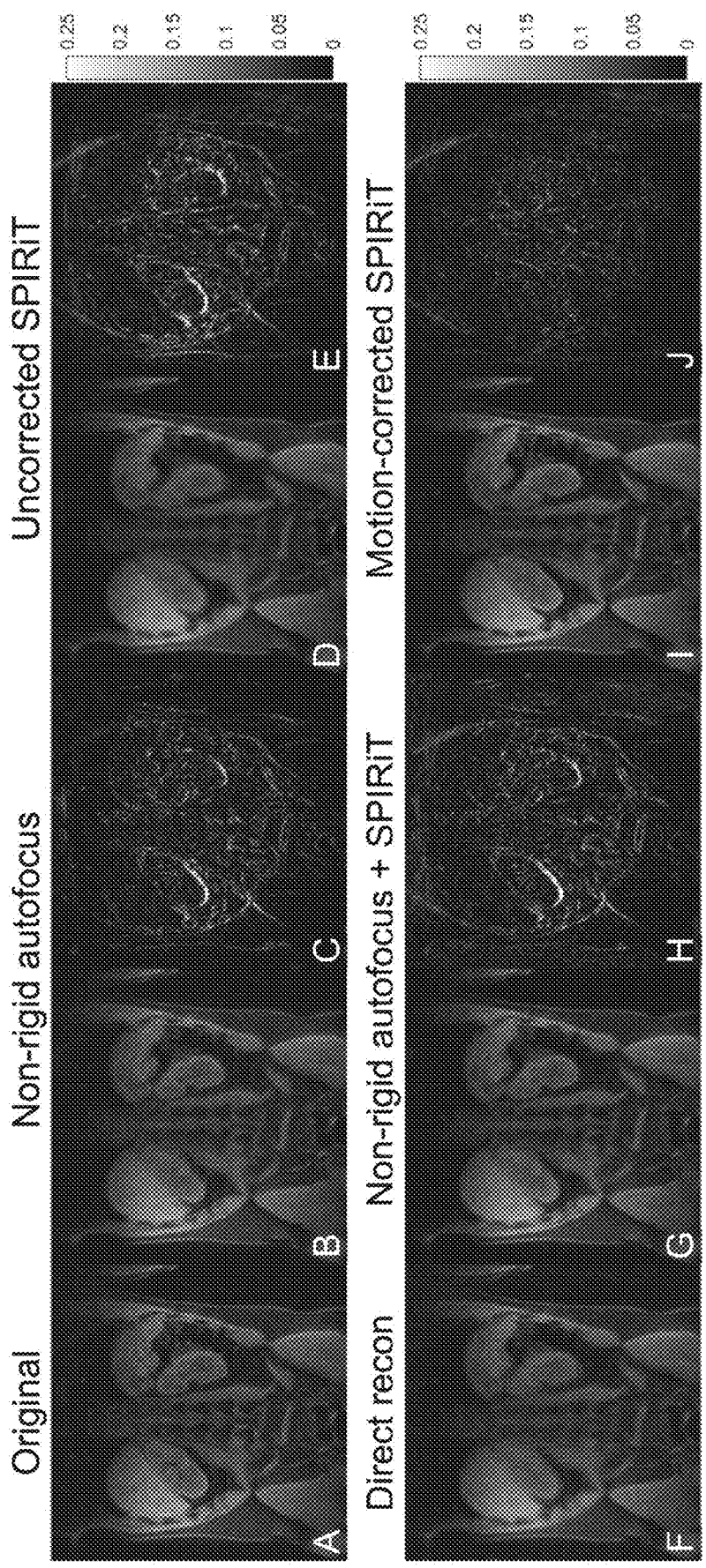
FIG. 8 compares the original image, MR images reconstructed using existing motion-correcting reconstruction techniques, and an MR image reconstructed according to some embodiments of the present disclosure.
Figure 9:
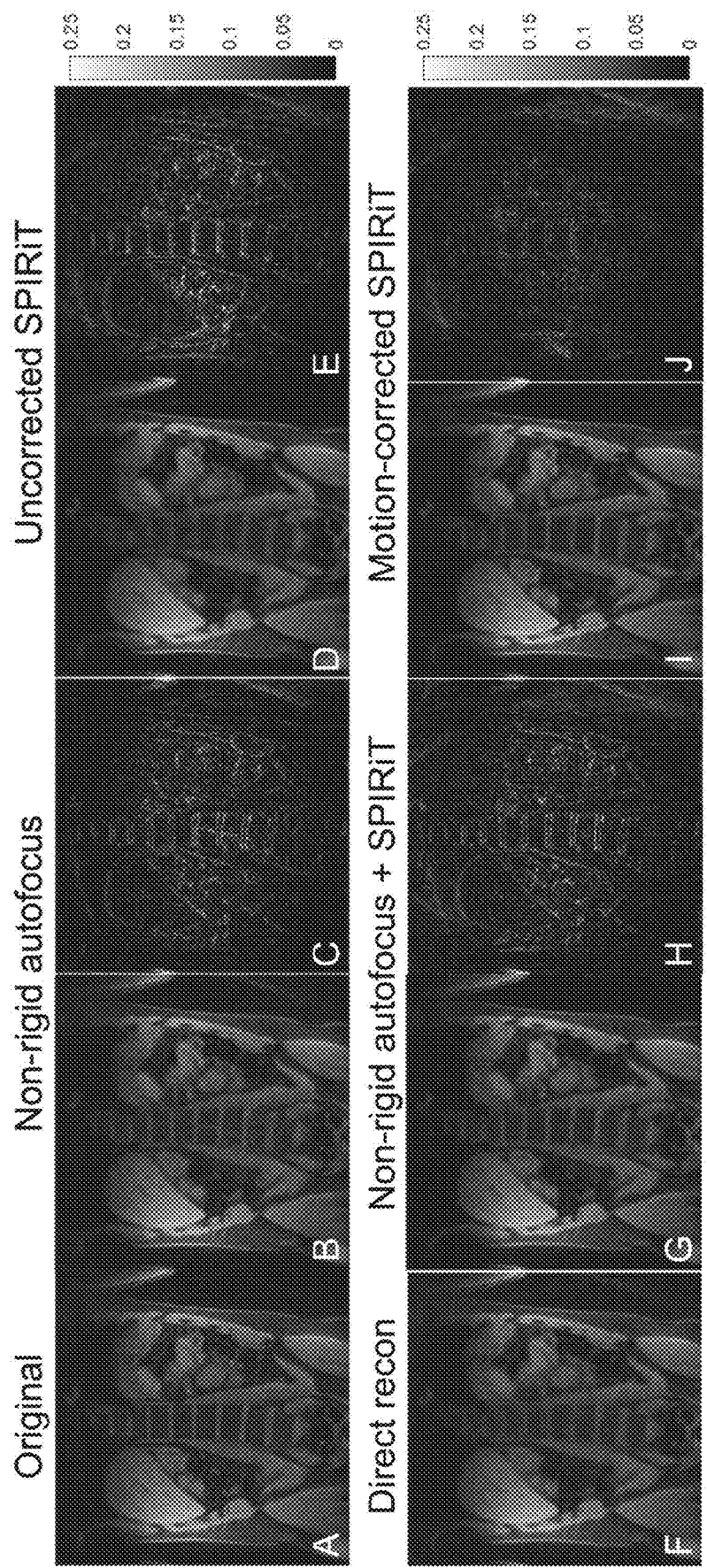
FIG. 9 compares the original image, MR images reconstructed using existing motion-correcting reconstruction techniques, and an MR image reconstructed according to some embodiments of the present disclosure.

FIGS. 8 and 9 each include the a set of images respectively corresponding to the two slices, each set including an original image A (ground truth), image B obtained using the existing autofocus method, image D obtained from conventional SPIRiT reconstruction, directly reconstructed image F, image G obtained by combining the existing autofocus method and SPIRiT reconstruction, and image I reconstructed by the proposed multi-scale motion estimation and SPIRiT reconstruction. The reconstructed images B, D, G, F are shown along with the corresponding difference images C, E, H, and J, showing the difference of the reconstructed images relative to the ground truth.

As shown in FIGS. 8 and 9, image D from conventional SPIRiT reconstruction produces a distorted image even with relatively small motion. The image I reconstructed using multi-scale motion-compensated reconstruction ("Motion-corrected SPIRiT") appears a bit blurred versus the original image, but it is a significant improvement over the blurring incurred by the other reconstruction methods. The outlines and most fine-scale details of the image I match those of the uncorrupted reconstruction. The image quality is also improved over the other reconstructions, with significantly reduced coherent structure in the difference image. More specifically, as demonstrated by the results shown in FIGS. 8 and 9, multi-scale motion-compensated reconstruction addresses the issue of nonrigid motion, producing an image with substantially reduced aliasing energy (as shown by the difference image J), without relying on navigators to track the motion. Neither of the autofocus reconstruction, with (G) or without (B) SPIRiT reconstruction, reduces aliasing as effectively (as shown by the difference images C and H).

Figure 10:
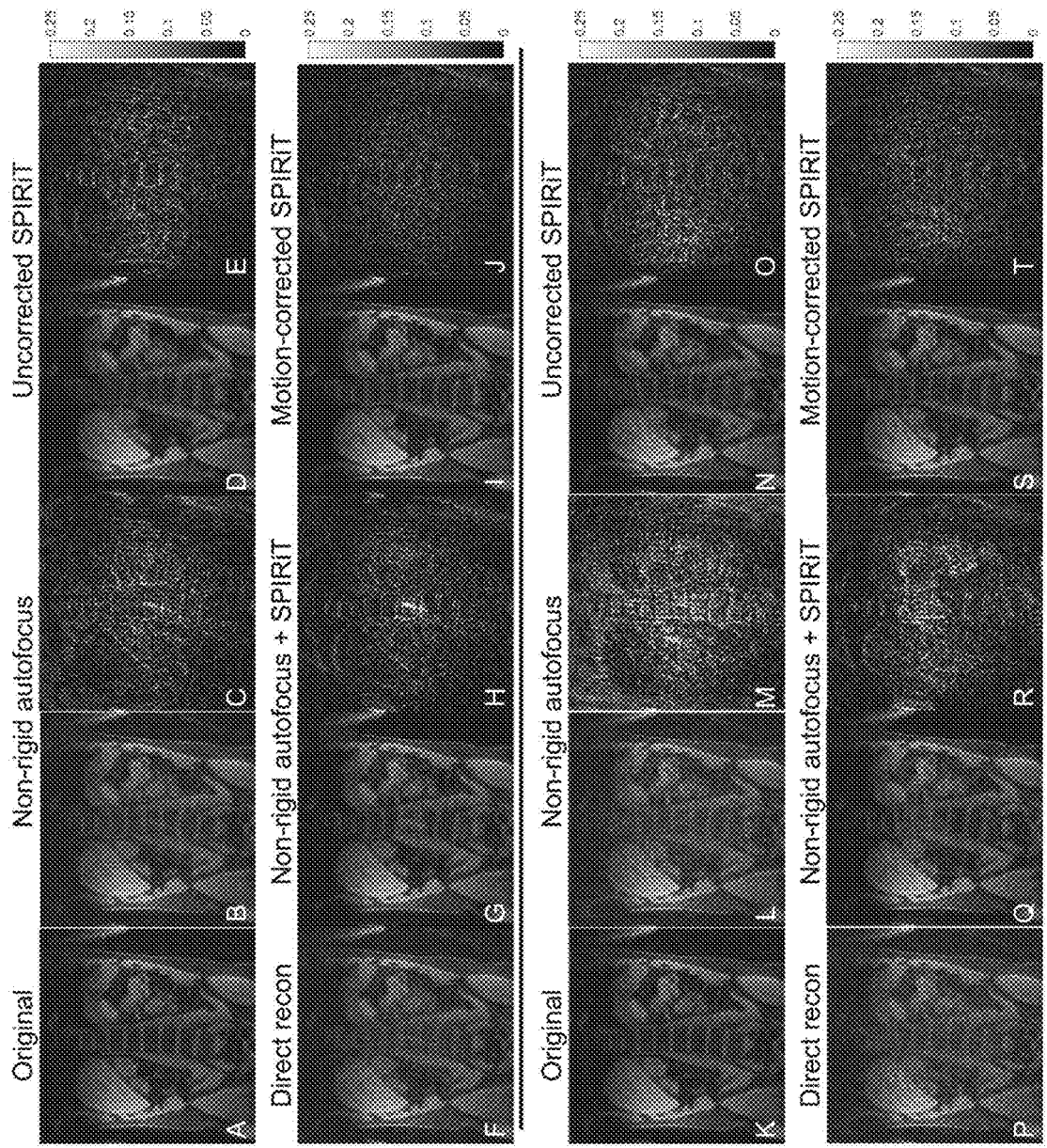
FIG. 10 compares the original image, MR images reconstructed using existing motion-correcting reconstruction techniques, and MR images reconstructed according to some embodiments of the present disclosure using undersampled k-space data.

FIG. 10 shows similar reconstructions for the same slice in FIG. 8 using k-space data with increased undersampling, where for the top two rows of images, the undersampling factor R equals to 2; for the bottom two rows of images, the undersampling factor R equals to 3. As the undersampling factor increases, the images obtained using multi-scale motion-compensated reconstruction (images I, J, S, T) show less degradation than those obtained using the other methods, and have noticeably reduced errors versus the other methods for both undersampling factors.

Figures 11A, 11B:
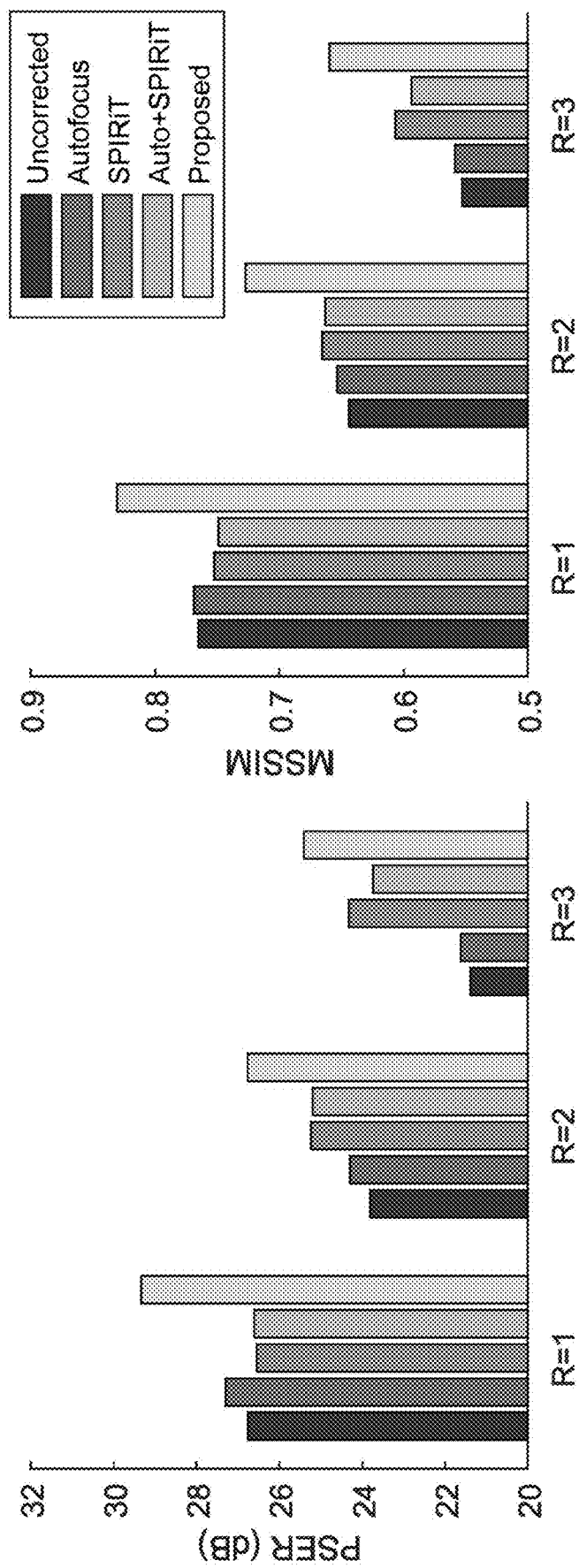
FIG. 11A compares the peak-signal-to-error ratio (PSER) of the existing motion-correcting reconstruction techniques and the multi-scale motion compensated reconstruction according to some embodiments of the present disclosure for different undersampled data sets.
FIG. 11B compares the mean structural similarity (MS-SIM) index of the existing motion-correcting reconstruction techniques and the multi-scale motion compensated reconstruction according to some embodiments of the present disclosure for different undersampled data sets.

In this second experiment, both mean PSER and mean SSIM values across all sixteen slices were measured. First, the statistical significance over all comparisons using single-factor ANOVA was measured. Since the obtained p-values were significant, post-hoc matched-pairs t-tests with Bonferroni correction were performed on the PSER and MSSIM values as shown in FIGS. 11A and 11B. For R=1, the fully sampled case, according to both metrics, a significant improvement in image quality using the proposed multi-scale motion-compensated reconstruction ("Proposed") was observed. The difference remains significant for R=2 and R=3, the undersampled cases. The p-values for both are listed in Table 1 below. Thus, the proposed multi-scale motion-compensated reconstruction outperforms the others as undersampling increases. In this case, the proposed multi-scale motion-compensated reconstruction is less competitive with SPIRiT at high undersampling. This may be due to undersampling-related errors that dominate the reconstruction error at high acceleration.

TABLE 1

The statistical significance of the improvement of the multi-scale motion-compensated reconstruction (JR) over uncorrected direct reconstruction (UC), autofocus (AF), SPIRiT (SP), and autofocus + SPIRiT (AS), for varying degrees of undersampling, whose average peak-signal-to-error ratio (PSER) and mean structural similarity (MSSIM) index values are depicted in FIGS. 11A and 11B. Significant values with $p < 0.05$ are in bold.

| PSERs MSSIMs | p(ANOVA) | p(JR > UC) | p(JR > AF) | p(JR > SP) | p(JR > AS) |
|---|---|---|---|---|---|
| R = 1 | 1.2e−5 | 2.3e−4 | 0.0055 | 5.6e−5 | 8.3e−5 |
|  | 3.4e−6 | 5.3e−4 | 0.0012 | 2.4e−5 | 9.9e−6 |

TABLE 1-continued

The statistical significance of the improvement of the multi-scale motion-compensated reconstruction (JR) over uncorrected direct recontruction (UC), autofocus (AF), SPIRiT (SP), and autofocus + SPIRiT (AS), for varying degrees of undersampling, whose average peak-signal-to-error ratio (PSER) and mean structural similarity (MSSIM) index values are depicted in FIGS. 11A and 11B. Significant values with $p < 0.05$ are in bold.

| PSERs MSSIMs | p(ANOVA) | p(JR > UC) | p(JR > AF) | p(JR > SP) | p(JR > AS) |
|---|---|---|---|---|---|
| R = 2 | 2.3e−9 | 1.2e−8 | 4.0e−7 | 0.0025 | 0.0017 |
|  | 1.5e−6 | 2.4e−6 | 3.1e−5 | 6.0e−4 | 3.3e−4 |
| R = 3 | 1.5e−19 | 9.9e−9 | 9.9e−9 | 0.031 | 1.6e−4 |
|  | 5.1e−11 | 1.0e−8 | 1.2e−8 | 0.0024 | 7.9e−5 |

Figures 12A, 12B:
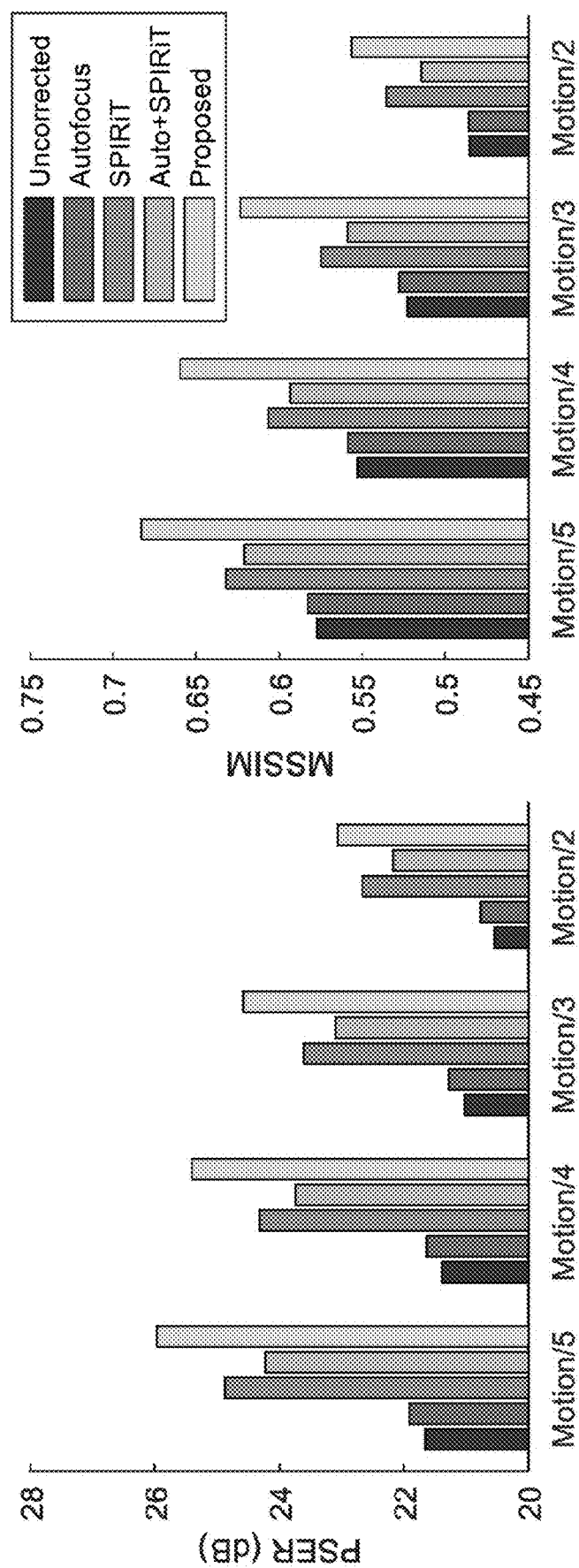
FIG. 12A compares the peak-signal-to-error ratio (PSER) of the existing motion-correcting reconstruction techniques and the multi-scale motion compensated reconstruction according to some embodiments of the present disclosure for varying motion severities.
FIG. 12B compares the mean structural similarity (MS-SIM) index of the existing motion-correcting reconstruction techniques and the multi-scale motion compensated reconstruction method according to some embodiments of the present disclosure for varying motion severities.

FIGS. 12A and 12B shows MSSIM and PSER values averaged across the 16 slices for different intensities of synthetic motion. The statistical significance of these means are different for each motion intensity using the same tests as before, and in most cases, the proposed multi-scale motion-compensated reconstruction provides statistically significant improvement as shown in FIGS. 12A and 12B (the p-values are listed in Table 2 below).

TABLE 2

The Statistical significance of the improvment of joint multi-scale motion-compensated reconstruction (JR) over uncorrected direct reconstruction (UC), autofocus (AF), SPIRiT (SP), and autofocus + SPIRiT (AS), for varying motion severities, whose average peak-signal-to-error ratio (PSER) and mean structural similarity (MSSIM) index values are depicted in FIGS. 12A and 12B. Significant values with $p < 0.05$ are in bold.

| PSERs MSSIMs | p(ANOVA) | p(JR > UC) | p(JR > AF) | p(JR > SP) | p(JR > AS) |
|---|---|---|---|---|---|
| Motion/5 | 6.6e−24 | 9.9e−9 | 9.9e−9 | 0.012 | 9.9e−6 |
|  | 5.4e−12 | 1.0e−8 | 1.0e−8 | 0.0019 | 8.7e−5 |
| Motion/4 | 1.5e−19 | 9.9e−9 | 9.9e−9 | 0.031 | 1.6e−4 |
|  | 5.1e−11 | 1.0e−8 | 1.2e−8 | 0.0024 | 7.9e−5 |
| Motion/3 | 7.1e−14 | 9.9e−9 | 1.0e−8 | 0.15 | 0.0058 |
|  | 4.7e−9 | 3.7e−8 | 1.1e−7 | 0.014 | 4.2e−4 |
| Motion/2 | 7.3e−8 | 3.7e−6 | 2.6e−5 | 0.90 | 0.29 |
|  | 4.7e−5 | 3.4e−4 | 3.9e−4 | 0.69 | 0.081 |

Figure 13:
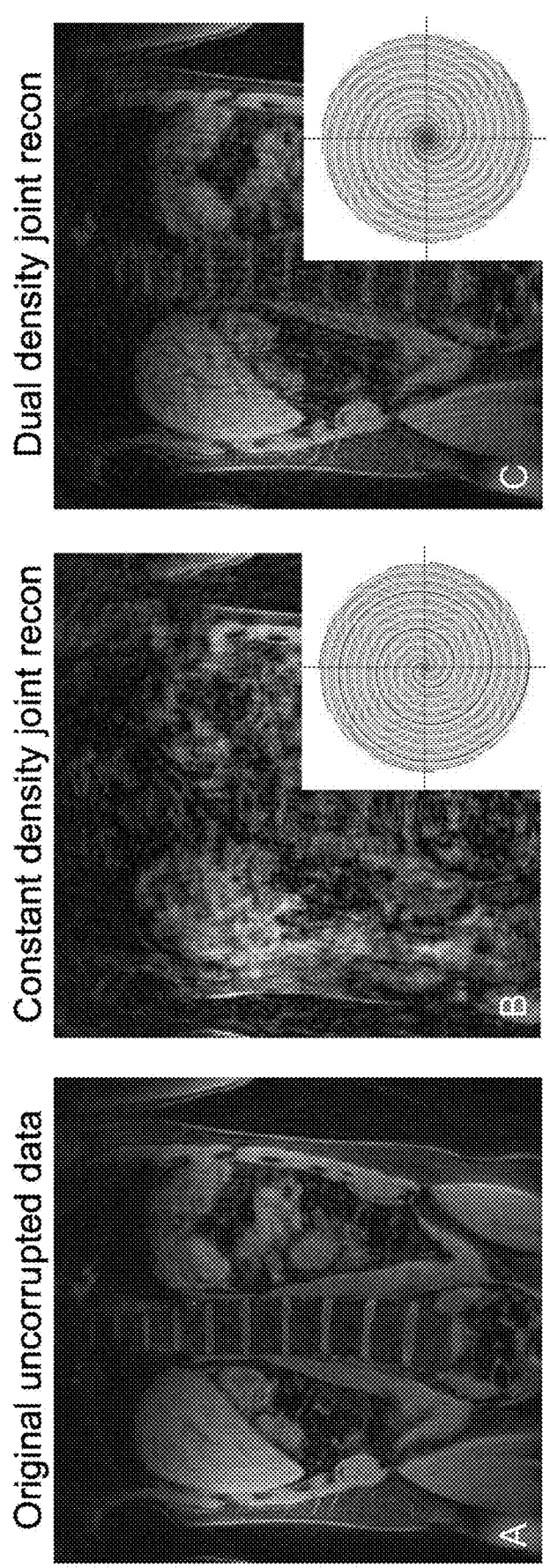
FIG. 13 compares the original image and MR images reconstructed using k-space data sampled in both constant-density and dual-density spiral trajectories, according to some embodiments of the present disclosure.

FIG. 13 compares the reconstructed images corrupted with simulated motion by the proposed multi-scale motion-compensated reconstruction using k-space data sampled in both constant-density and dual-density spiral trajectories. Image A shows the ideal image without motion blurs, image B shows the image reconstructed from 3×-undersampled constant density k-space data, and image C shows the image reconstructed from undersampled dual density k-space data. As shown in FIG. 13, the proposed multi-scale motion-compensated reconstruction performs significantly better with dual-density data than constant-density data. This is because the low-resolution information used to initialize the coarsest scale of motion estimation does not suffer from the aliasing energy present with constant-density data.

Figure 14:
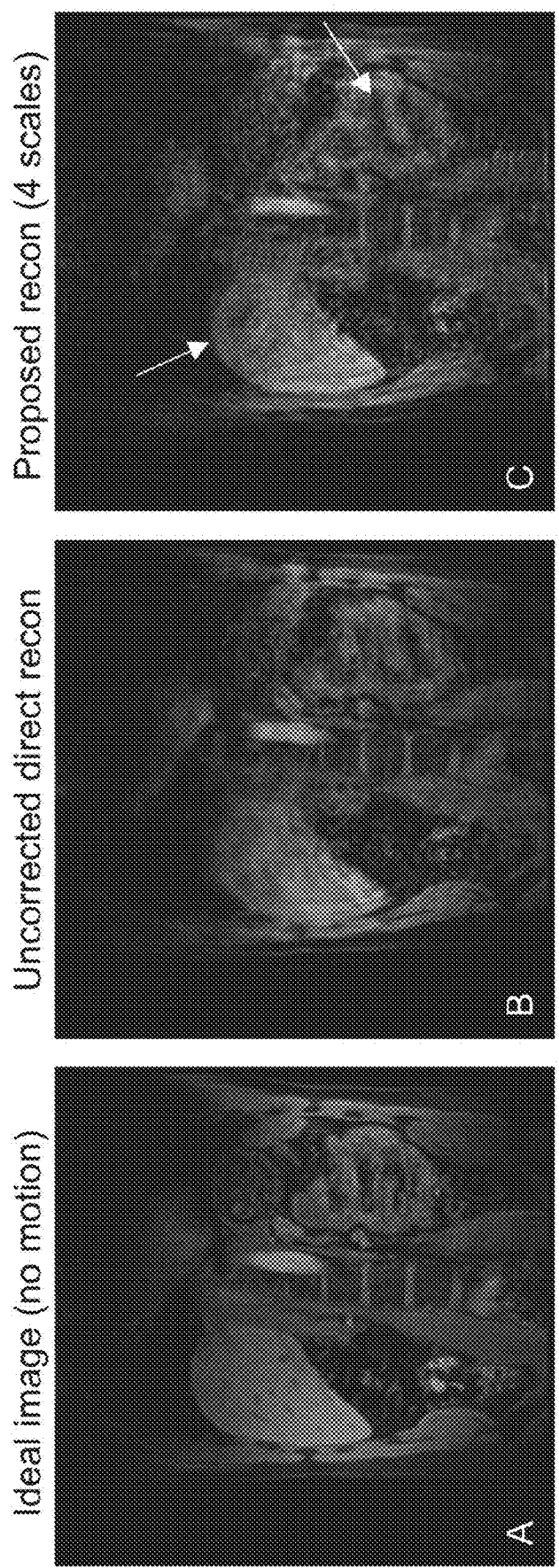
FIG. 14 compares the original image, an MR image reconstructed directly, an MR image reconstructed using the multi-scale motion-compensated reconstruction according to some embodiments of the present disclosure.

FIG. 14 shows the result of applying the proposed multi-scale motion-compensated reconstruction to free-breathing data (with real motion) acquired using the same paradigm as the breath-held data used previously. The subject was encouraged to breathe normally during the 30-second scan. Image A is the idealized breath-held image, image B is the direct reconstruction, and image C is reconstructed using the proposed multi-scale motion-compensated reconstruction. As shown in FIG. 14, the direct reconstruction B of these free-breathing data is highly blurred by motion, compared to the ideal breath-held image A. The proposed reconstruction C sharpens some of the low-resolution features of the reconstruction.

As described herein, the experimental data are presented herein for purposes of illustration and should not be construed as limiting the scope of the present disclosure in any way or excluding any alternative or additional embodiments.

Exemplary Systems Consistent with Embodiments of the Present Disclosure

Various aspects of the present disclosure may be performed by an MRI system, a computer system, a hardware system, or a machine. Exemplar embodiments for performing one or more aspects of the embodiments of the present disclosure will be described below with reference to one or more exemplary embodiments described above and illustrated in FIGS. 1-6.

Figure 15:
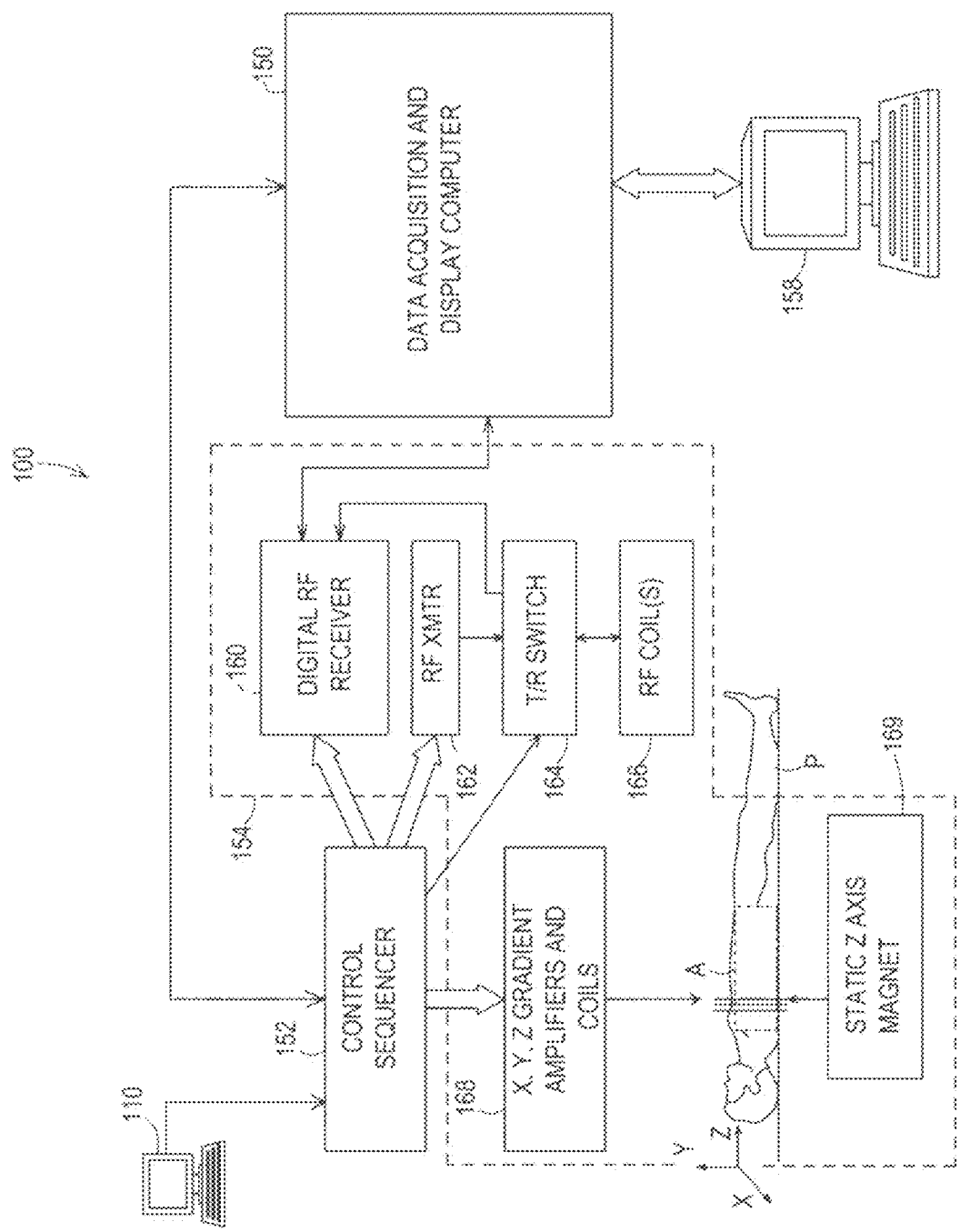
FIG. 15 illustrates an exemplary MRI system, according to some embodiments of the present disclosure.

FIG. 15 shows a system diagram illustrating an operating environment capable of implementing aspects of the present disclosure in accordance with one or more exemplary embodiments. FIG. 15 illustrates an example of an Mill system 100, including a data acquisition and display computer 150 coupled to an operator console 110, an MM real-time control sequencer 152, and an Mill subsystem 154. The Mill subsystem 154 may include XYZ magnetic gradient coils and associated amplifiers 168, a static Z-axis magnet 169, a digital RF transmitter 162, a digital RF receiver 160, a transmit/receive switch 164, and RF coil(s) 166. The MRI subsystem 154 may be controlled in real time by control sequencer 152 to generate magnetic and radio frequency fields that stimulate magnetic resonance phenomena in a subject P to be imaged, for example to implement magnetic resonance imaging sequences in accordance with various embodiments of the present disclosure. A contrast-enhanced image of an area of interest A of the subject P (which may also be referred to herein as a "region of interest") may be shown on display 158. The display 158 may be implemented through a variety of output interfaces, including a monitor, printer, or data storage.

The area of interest A corresponds to a region associated with one or more physiological activities in subject P. The area of interest shown in the exemplary embodiment of FIG. 15 corresponds to a chest region of subject P, but it should be appreciated that the area of interest for purposes of implementing various aspects of the disclosure presented herein is not limited to the chest area. It should be recognized and appreciated that the area of interest in various embodiments may encompass various areas of subject P associated with various physiological characteristics, such as, but not limited to the heart region, brain region, upper or lower extremities, or other organs or tissues. Physiological activities that may be evaluated by methods and systems in accordance with various embodiments of the present disclosure may include, but are not limited to, various cardiac activities including myocardial strain, and also may relate to aspects of fluid flow and/or muscular or other organ movement or other conditions.

It should be appreciated that any number and type of computer-based medical imaging systems or components, including various types of commercially available medical imaging systems and components, may be used to practice certain aspects of the present disclosure. Systems as described herein with respect to exemplary embodiments are not intended to be specifically limited to MRI implementations or the particular system shown in FIG. 15.

One or more data acquisition or data collection steps as described herein in accordance with one or more embodiments may include acquiring, collecting, receiving, or otherwise obtaining data such as imaging data corresponding to an area of interest. By way of example, data acquisition or collection may include acquiring data via a data acquisition device, receiving data from an on-site or off-site data acquisition device or from another data collection, storage, or processing device. Similarly, data acquisition or data collection devices of a system in accordance with one or more embodiments of the present disclosure may include any device configured to acquire, collect, or otherwise obtain data, or to receive data from a data acquisition device within the system, an independent data acquisition device located on-site or off-site, or another data collection, storage, or processing device.

Figure 16:
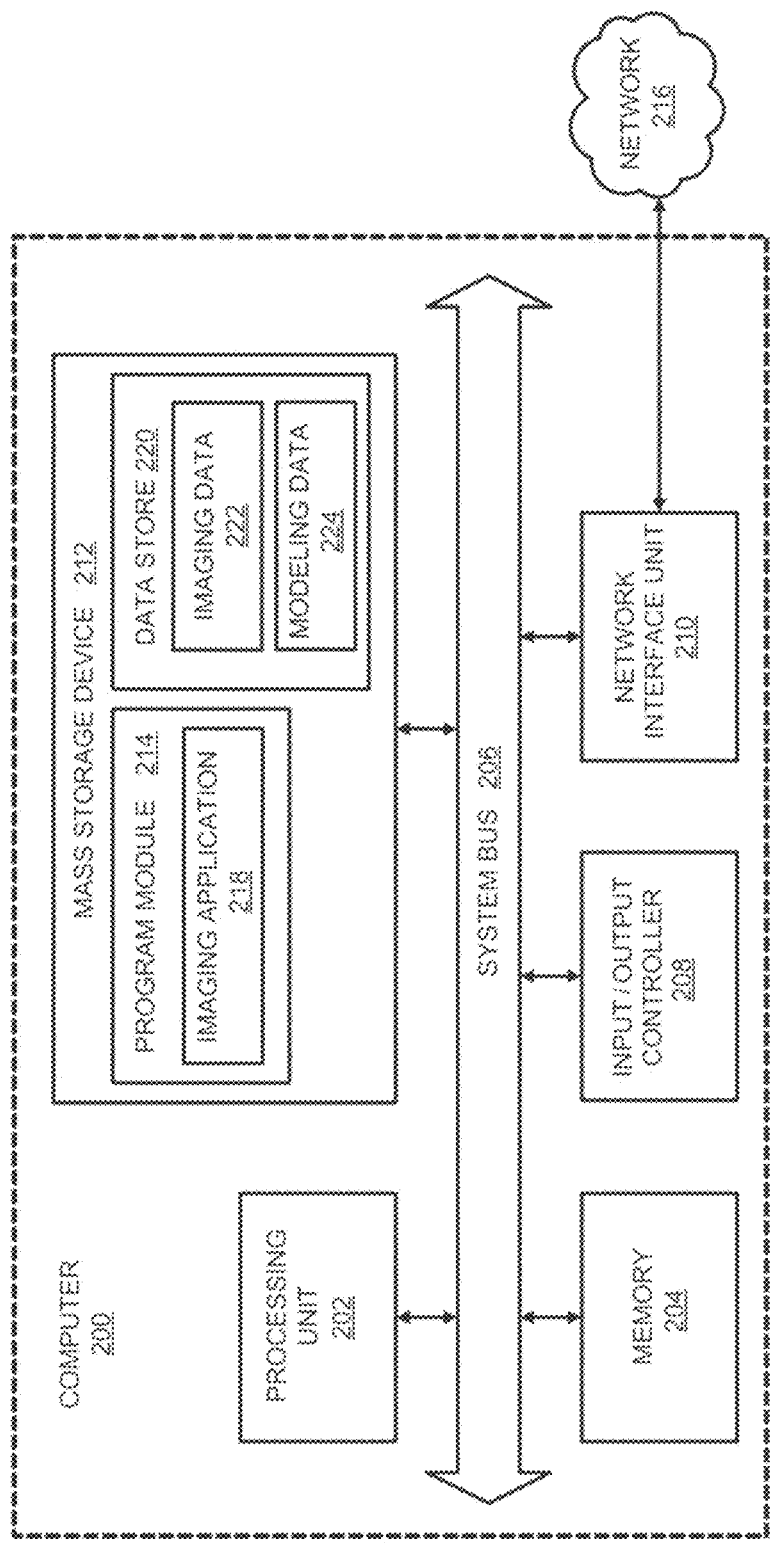
FIG. 16 illustrates an exemplary general computing system, according to some embodiments of the present disclosure.

FIG. 16 is a computer architecture diagram showing a general computing system capable of implementing aspects of the present disclosure in accordance with one or more embodiments described herein. A computer 200 may be configured to perform one or more functions associated with embodiments illustrated in one or more of FIGS. 1-6. It should be appreciated that the computer 200 may be implemented within a single computing device or a computing system formed with multiple connected computing devices. The computer 200 may be configured to perform various distributed computing tasks, in which processing and/or storage resources may be distributed among the multiple devices. The data acquisition and display computer 150 and/or operator console 110 of the system shown in FIG. 16 may include one or more systems and components of the computer 200.

As shown in FIG. 16, the computer 200 includes a processing unit 202 ("CPU"), a system memory 204, and a system bus 206 that couples the memory 204 to the CPU 202. The computer 200 further includes a mass storage device 212 for storing program modules 214. The program modules 214 may be operable to perform operations associated with embodiments illustrated in one or more of FIGS. 1-6. The program modules 214 may include an imaging application 218 for performing data acquisition and/or processing functions as described herein, for example to acquire and/or process image data corresponding to magnetic resonance imaging of an area of interest. The computer 200 can include a data store 220 for storing data that may include imaging-related data 222, such as acquired k-space data from the implementation of magnetic resonance imaging pulse sequences in accordance with various embodiments of the present disclosure.

The mass storage device 212 is connected to the CPU 202 through a mass storage controller (not shown) connected to the bus 206. The mass storage device 212 and its associated computer-storage media provide non-volatile storage for the computer 200. Although the description of computer-storage media contained herein refers to a mass storage device, such as a hard disk or CD-ROM drive, it should be appreciated by those skilled in the art that computer-storage media can be any available computer storage media that can be accessed by the computer 200.

By way of example and not limitation, computer storage media (also referred to herein as "computer-readable storage medium" or "computer-readable storage media") may include volatile and non-volatile, removable and non-removable media implemented in any method or technology for storage of information such as computer-storage instructions, data structures, program modules, or other data. For example, computer storage media includes, but is not limited to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer 200. "Computer storage media," "computer-readable storage medium," or "computer-readable storage media" as described herein do not include transitory signals.

According to various embodiments, the computer 200 may operate in a networked environment using connections to other local or remote computers through a network 216 via a network interface unit 210 connected to the bus 206. The network interface unit 210 may facilitate connection of the computing device inputs and outputs to one or more suitable networks and/or connections such as a local area network (LAN), a wide area network (WAN), the Internet, a cellular network, a radio frequency (RF) network, a Bluetooth-enabled network, a Wi-Fi enabled network, a satellite-based network, or other wired and/or wireless networks for communication with external devices and/or systems. The computer 200 may also include an input/output controller 208 for receiving and processing input from any of a number of input devices. Input devices may include one or more of keyboards, mice, stylus, touchscreens, microphones, audio capturing devices, and image/video capturing devices. An end user may utilize the input devices to interact with a user interface, for example, a graphical user interface, for managing various functions performed by the computer 200. The bus 206 may enable the processing unit 202 to read code and/or data to/from the mass storage device 212 or other computer-storage media.

The computer-storage media may represent apparatus in the form of storage elements that are implemented using any suitable technology, including but not limited to semiconductors, magnetic materials, optics, or the like. The computer-storage media may represent memory components, whether characterized as RAM, ROM, flash, or other types of technology. The computer storage media may also represent secondary storage, whether implemented as hard drives or otherwise. Hard drive implementations may be characterized as solid state, or may include rotating media storing magnetically-encoded information.

The program modules 214, which include the imaging application 218, may include instructions that, when loaded into the processing unit 202 and executed, cause the computer 200 to provide functions associated with one or more embodiments illustrated in FIGS. 1-6. The program modules 214 may also provide various tools or techniques by which the computer 200 may participate within the overall systems or operating environments using the components, flows, and data structures discussed throughout this description.

In general, the program modules 214 may, when loaded into the processing unit 202 and executed, transform the processing unit 202 and the overall computer 200 from a general-purpose computing system into a special-purpose computing system. The processing unit 202 may be constructed from any number of transistors or other discrete circuit elements, which may individually or collectively assume any number of states. More specifically, the processing unit 202 may operate as a finite-state machine, in response to executable instructions contained within the program modules 214. These computer-executable instructions may transform the processing unit 202 by specifying how the processing unit 202 transitions between states, thereby transforming the transistors or other discrete hardware elements constituting the processing unit 202. Encoding the program modules 214 may also transform the physical structure of the computer-storage media. The specific transformation of physical structure may depend on various factors, in different implementations of this description. Examples of such factors may include, but are not limited to the technology used to implement the computer-storage media, whether the computer storage media are characterized as primary or secondary storage, and the like. For example, if the computer storage media are implemented as semiconductor-based memory, the program modules 214 may transform the physical state of the semiconductor memory, when the software is encoded therein. For example, the program modules 214 may transform the state of transistors, capacitors, or other discrete circuit elements constituting the semiconductor memory.

As another non-limiting example, the computer storage media may be implemented using magnetic or optical technology. In such implementations, the program modules 214 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. Other transformations of physical media are possible without departing from the scope of the present description, with the foregoing examples provided only to facilitate this discussion.

Figure 17:
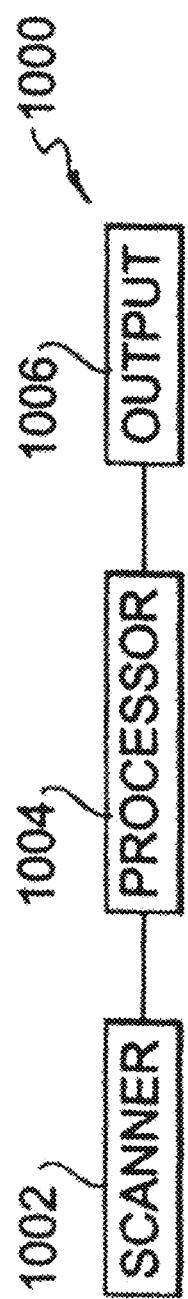
FIG. 17 illustrates an exemplary hardware system, according to some embodiments of the present disclosure.

FIG. 17 is a schematic diagram of hardware for implementing aspects of the present disclosure in accordance with one or more exemplary embodiments. For example, the hardware 1000 includes a scanner 1002 (e.g., MM and/or ultrasound), a processor 1004 for performing the operations disclosed herein, and a display or other output 1006.

Figure 18:
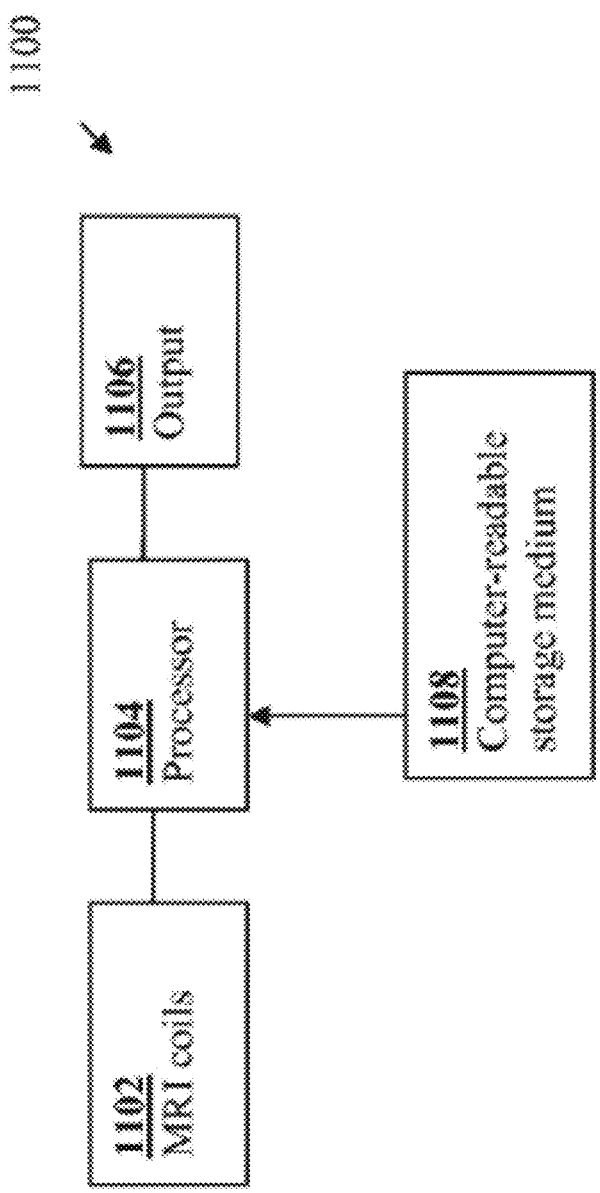
FIG. 18 illustrates another exemplary MM system, according to some embodiments of the present disclosure.

FIG. 18 is a schematic diagram of a system 1100 for implementing aspects of the present disclosure in accordance with one or more exemplary embodiments. The system 1100 may include MR coils 1102 for taking raw image data from the subject, a processor 1104 for performing any of the operations described above, and an output 1106 for outputting the image. The output 1106 can include one or more of a display, a printer, and a transmission line for transmitting the image to a remote location. Code for performing the above operations can be supplied to the processor on any suitable computer-readable medium 1108.

Figure 19:
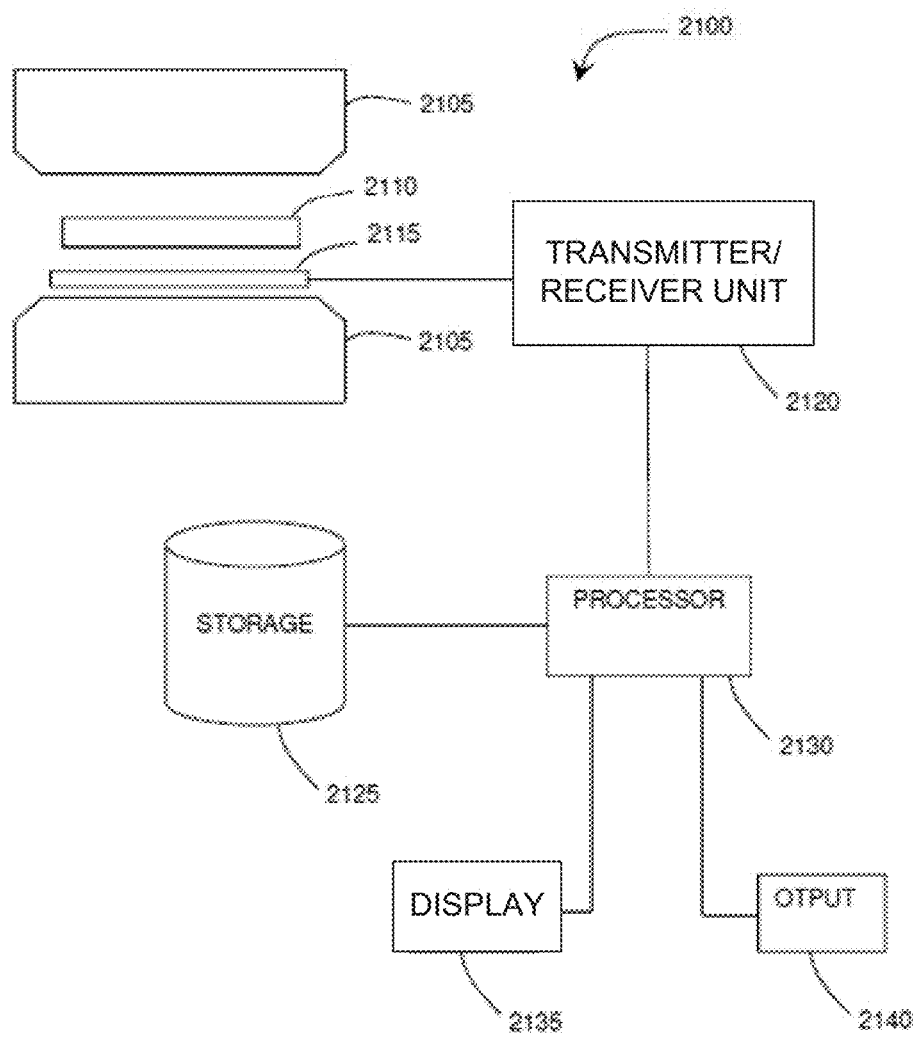
FIG. 19 illustrates another exemplary MM system, according to some embodiments of the present disclosure.

FIG. 19 provides a schematic block diagram of a magnetic resonance system 2100 for implementing aspects of the present disclosure in accordance with one or more exemplary embodiments. The system 2100, or selected parts thereof, can be referred to as an MR scanner. The diagram provides a system 2100 on which various embodiments as disclosed herein, or any other applicable embodiments as desired or required, can be implemented. The magnetic resonance system 2100, in one example, depicts an imaging system 2100 having magnet 2105. The magnet 2105 can provide a biasing magnetic field. A coil 2115 and subject 2110 are positioned within the field of magnet 2105. The subject 2110 can include a human body, an animal, a phantom, or other specimen. The coil 2115 can include a transmit coil, a receive coil, a separate transmit coil and receive coil, or a transceiver coil. The coil 2115 is in communication with a transmitter/receiver unit 2120 and with a processor 2130. In various examples, the coil 2115 both transmits and receives radio frequency (RF) signals relative to subject 2110. The transmitter/receiver unit 2120 can include a transmit/receive switch, an analog-to-digital converter (ADC), a digital-to-analog converter (DAC), an amplifier, a filter, or other modules configured to excite coil 2115 and to receive a signal from the coil 2115. Transmitter/receiver unit 2120 is coupled to the processor 2130.

The processor 2130 can include a digital signal processor, a microprocessor, a controller, or other module. The processor 2130, in one example, is configured to generate an excitation signal (for example, a pulse sequence) for the coil 2115. The processor 2130, in one example, is configured to perform a post-processing operation on the signal received from the coil 2115. The processor 2130 is also coupled to storage 2125, display 2135 and output unit 2140.

The storage 2125 can include a memory for storing data. The data can include image data as well as results of processing performed by the processor 2130. In one example, the storage 2125 provides storage for executable instructions for use by the processor 2130. The instructions can be configured to generate and deliver a particular pulse sequence or to implement a particular algorithm.

The display 2135 can include a screen, a monitor, or other device to render a visible image corresponding to the subject 2110. For example, the display 2135 can be configured to display a radial projection, a Cartesian coordinate projection, photographic or video depictions, one-dimensional or two-dimensional images, or other view corresponding to subject 2110. The output unit 2140 can include a printer, a storage device, a network interface or other device configured to receive processed data.

The system 2100 may include the Mill coil 2115 for taking raw image data from the subject, the processor 2130 may be capable for performing any of the operations described above or herein disclosed, the output 2140 may be capable for outputting the image, and the display 2135 may be capable for displaying the image. The output 2140 can include one or more of a printer, storage device and a transmission line for transmitting the image to a remote location. Code for performing the above operations can be supplied to the processor 2130 on a computer-readable medium or any suitable computer-readable storage medium. The computer-readable medium includes executable instructions stored thereon for performing any of the methods disclosed herein or as desired or required for practicing the present invention or aspects of the present invention.

Figure 20:
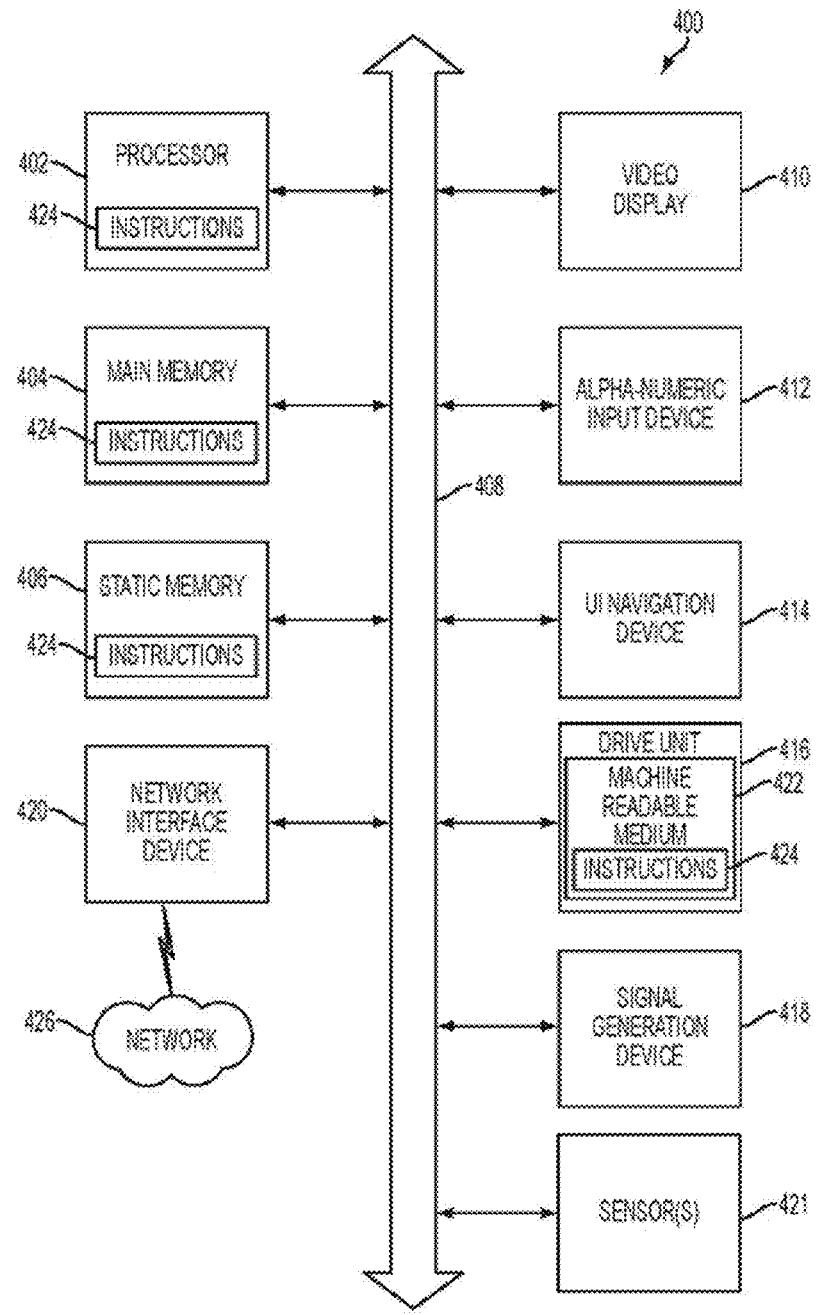
FIG. 20 illustrates an exemplary computing system, according to some embodiments of the present disclosure.

FIG. 20 illustrates a block diagram of an exemplary computing system 400 for implementing aspects of the present disclosure in accordance with one or more exemplary embodiments. Examples of computing system 400 can include logic, one or more components, circuits (e.g., modules), or mechanisms. Circuits are tangible entities configured to perform certain operations. In an example, circuits can be arranged (e.g., internally or with respect to external entities such as other circuits) in a specified manner. In one exemplary embodiment, one or more computer systems (e.g., a standalone, client or server computer system) or one or more hardware processors (processors) can be configured by software (e.g., instructions, an application portion, or an application) as a circuit that operates to perform certain operations as described herein. In one exemplary embodiment, the software can reside (1) on a non-transitory computer-readable medium or (2) in a transmission signal. In one exemplary embodiment, the software, when executed by the underlying hardware of the circuit, causes the circuit to perform the certain operations.

In one exemplary embodiment, a circuit can be implemented mechanically or electronically. For example, a circuit can comprise dedicated circuitry or logic that is specifically configured to perform one or more techniques such as discussed above, such as including a special-purpose processor, a field programmable gate array (FPGA) or an application-specific integrated circuit (ASIC). In one exemplary embodiment, a circuit can comprise programmable logic (e.g., circuitry, as encompassed within a general-purpose processor or other programmable processor) that can be temporarily configured (e.g., by software) to perform the certain operations. It will be appreciated that the decision to implement a circuit mechanically (e.g., in dedicated and permanently configured circuitry), or in temporarily configured circuitry (e.g., configured by software) can be driven by cost and time considerations.

Accordingly, the term "circuit" is understood to encompass a tangible entity, be that an entity that is physically constructed, permanently configured (e.g., hardwired), or temporarily (e.g., transitorily) configured (e.g., programmed) to operate in a specified manner or to perform specified operations. In one exemplary embodiment, given a plurality of temporarily configured circuits, each of the circuits need not be configured or instantiated at any one instance in time. For example, where the circuits comprise a general-purpose processor configured via software, the general-purpose processor can be configured as respective different circuits at different times. Software can accordingly configure a processor, for example, to constitute a particular circuit at one instance of time and to constitute a different circuit at a different instance of time.

In one exemplary embodiment, circuits can provide information to, and receive information from, other circuits. In this example, the circuits can be regarded as being communicatively coupled to one or more other circuits. Where multiple of such circuits exist contemporaneously, communications can be achieved through signal transmission (e.g., over appropriate circuits and buses) that connect the circuits. In embodiments in which multiple circuits are configured or instantiated at different times, communications between such circuits can be achieved, for example, through the storage and retrieval of information in memory structures to which the multiple circuits have access. For example, one circuit can perform an operation and store the output of that operation in a memory device to which it is communicatively coupled. A further circuit can then, at a later time, access the memory device to retrieve and process the stored output. In one exemplary embodiment, circuits can be configured to initiate or receive communications with input or output devices and can operate on a resource (e.g., a collection of information).

The various operations of method examples described herein can be performed, at least partially, by one or more processors that are temporarily configured (e.g., by software) or permanently configured to perform the relevant operations. Whether temporarily or permanently configured, such processors can constitute processor-implemented circuits that operate to perform one or more operations or functions. In one exemplary embodiment, the circuits referred to herein can comprise processor-implemented circuits.

Similarly, the methods described herein can be at least partially processor-implemented. For example, at least some of the operations of a method can be performed by one or processors or processor-implemented circuits. The performance of certain of the operations can be distributed among the one or more processors, not only residing within a single computing system, but deployed across a number of computing systems. In one exemplary embodiment, the processor or processors can be located in a single location (e.g., within a home environment, an office environment or as a server farm), while in other examples the processors can be distributed across a number of locations.

The one or more processors can also operate to support performance of the relevant operations in a "cloud computing" environment or as a "software as a service" (SaaS). For example, at least some of the operations can be performed by a group of computers (as examples of computing systems including processors), with these operations being accessible via a network (e.g., the Internet) and via one or more appropriate interfaces (e.g., Application Program Interfaces (APIs)).

Exemplary embodiments (e.g., apparatus, systems, or methods) can be implemented in digital electronic circuitry, in computer hardware, in firmware, in software, or in any combination thereof. Exemplary embodiments can be implemented using a computer program product (e.g., a computer program, tangibly embodied in an information carrier or in a computer-readable medium, for execution by, or to control the operation of, data processing apparatus such as a programmable processor, a computer, or multiple computers).

A computer program can be written in any form of programming language, including compiled or interpreted languages, and it can be deployed in any form, including as a stand-alone program or as a software module, subroutine, or other unit suitable for use in a computing environment. A computer program can be deployed to be executed on one computer or on multiple computers at one site or distributed across multiple sites and interconnected by a communication network.

In one exemplary embodiment, operations can be performed by one or more programmable processors executing a computer program to perform functions by operating on input data and generating output. Examples of method operations can also be performed by, and example apparatus can be implemented as, special purpose logic circuitry (e.g., a field programmable gate array (FPGA) or an application-specific integrated circuit (ASIC)).

The computing system can include clients and servers. A client and server are generally remote from each other and generally interact through a communication network. The relationship of client and server arises by virtue of computer programs running on the respective computers and having a client-server relationship to each other. In embodiments deploying a programmable computing system, it will be appreciated that both hardware and software architectures require consideration. It will be appreciated that the choice of whether to implement certain functionality in permanently configured hardware (e.g., an ASIC), in temporarily configured hardware (e.g., a combination of software and a programmable processor), or a combination of permanently and temporarily configured hardware can be a design choice. Below are set out hardware (e.g., computing system 400) and software architectures that can be deployed in exemplary embodiments.

In one exemplary embodiment, the computing system 400 can operate as a standalone device or the computing system 400 can be connected (e.g., networked) to other machines or systems.

In a networked deployment, the computing system 400 can operate in the capacity of either a server or a client machine in server-client network environments. In one exemplary embodiment, computing system 400 can act as a peer computing system in peer-to-peer (or other distributed) network environments. The computing system 400 can be a personal computer (PC), a tablet PC, a set-top box (STB), a Personal Digital Assistant (PDA), a mobile telephone, a web appliance, a network router, switch or bridge, or any machine capable of executing instructions (sequential or otherwise) specifying actions to be taken (e.g., performed) by the computing system 400. Further, while only a single computing system 400 is illustrated, any collection of computing systems may individually or jointly execute a set (or multiple sets) of instructions to perform any one or more of the methodologies discussed herein.

Computing system 400 can include a processor 402 (e.g., a central processing unit (CPU), a graphics processing unit (GPU) or both), a main memory 404 and a static memory 406, some or all of which can communicate with each other via a bus 408. The computing system 400 can further include a display unit 410, an alphanumeric input device 412 (e.g., a keyboard), and a user interface (UI) navigation device 411 (e.g., a mouse). In one exemplary embodiment, the display unit 810, input device 417 and UI navigation device 414 can be a touch screen display. The computing system 400 can additionally include a storage device (e.g., drive unit) 416, a signal generation device 418 (e.g., a speaker), a network interface device 420, and one or more sensors 421, such as a global positioning system (GPS) sensor, compass, accelerometer, or other suitable sensors.

The storage device 416 can include a computer-readable medium 422 on which is stored one or more sets of data structures or instructions 424 (e.g., software) embodying or utilized by any one or more of the methodologies or functions described herein. The instructions 424 can also reside, completely or at least partially, within the main memory 404, within static memory 406, or within the processor 402 during execution thereof by the computing system 400. In one exemplary embodiment, one or any combination of the processor 402, the main memory 404, the static memory 406, or the storage device 416 can constitute computer-readable media.

While the computer-readable medium 422 is illustrated as a single medium, the term "computer-readable medium" can include a single medium or multiple media (e.g., a centralized or distributed database, and/or associated caches and servers) that configured to store the one or more instructions 424. The term "computer-readable medium" can also be taken to include any tangible medium that is capable of storing, encoding, or carrying instructions for execution by the computing system and that cause the computing system to perform any one or more of the methodologies of the present disclosure or that is capable of storing, encoding or carrying data structures utilized by or associated with such instructions. The term "computer-readable medium" can accordingly be taken to include, but not be limited to, solid-state memories, and optical and magnetic media. Specific examples of computer-readable media can include non-volatile memory, including, by way of example, semiconductor memory devices (e.g., Electrically Programmable Read-Only Memory (EPROM), Electrically Erasable Programmable Read-Only Memory (EEPROM)) and flash memory devices; magnetic disks such as internal hard disks and removable disks; magneto-optical disks; and CD-ROM and DVD-ROM disks.

The instructions 424 can further be transmitted or received over a communications network 426 using a transmission medium via the network interface device 420 utilizing any one of a number of transfer protocols (e.g., frame relay, IP, TCP, UDP, HTTP, etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., IEEE 802.11 standards family known as Wi-Fi®, IEEE 802.16 standards family known as WiMax®), peer-to-peer (P2P) networks, among others. The term "transmission medium" shall be taken to include any intangible medium that is capable of storing, encoding or carrying instructions for execution by the computing system, and includes digital or analog communications signals or other intangible medium to facilitate communication of such software.

It should be appreciated that any of the components or modules referred to with regards to any of the present invention embodiments discussed herein, may be integrally or separately formed with one another. Further, redundant functions or structures of the components or modules may be implemented. Moreover, the various components may be communicated locally and/or remotely with any user/clinician/patient or machine/system/computer/processor. Moreover, the various components may be in communication via wireless and/or hardwire or other desirable and available communication means, systems and hardware. Moreover, various components and modules may be substituted with other modules or components that provide similar functions.

It should be appreciated that the device and related components discussed herein may take on all shapes along the entire continual geometric spectrum of manipulation of x, y and z planes to provide and meet the anatomical, environmental, and structural demands and operational requirements. Moreover, locations and alignments of the various components may vary as desired or required.

Some aspects of the present disclosure relate to MRI. Some disclosed embodiments relate to a system, method, and computer readable medium for providing motion-compensated reconstruction of magnetic resonance images from fully sampled data. Some disclosed embodiments relate to a system, method, and computer-readable medium for providing motion-compensated reconstruction of magnetic resonance images from fully sampled or undersampled data.

Although exemplary embodiments of the present disclosure are explained in detail herein, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing exemplary embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

As discussed herein, a "subject" may be any applicable human, animal, or other organism, living or dead, or other biological or molecular structure or chemical environment, and may relate to particular components of the subject, for instance specific tissues or fluids of a subject (e.g., human tissue in a particular area of the body of a living subject), which may be in a particular location of the subject, referred to herein as an "area of interest" or a "region of interest."

All references cited and discussed in this specification are incorporated herein by reference in their entireties and to the same extent as if each reference was individually incorporated by reference.

The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g. 1 to 5 includes 1, 1.5, 2, 2.75, 3, 3.90, 4, 4.24, and 5). Similarly, numerical ranges recited herein by endpoints include subranges subsumed within that range (e.g. 1 to 5 includes 1-1.5, 1.5-2, 2-2.75, 2.75-3, 3-3.90, 3.90-4, 4-4.24, 4.24-5, 2-5, 3-5, 1-4, and 2-4). It is also to be understood that all numbers and fractions thereof are presumed to be modified by the term "about."

It should be appreciated that various sizes, dimensions, contours, rigidity, shapes, flexibility and materials of any of the components or portions of components in the various embodiments discussed throughout may be varied and utilized as desired or required.

Other embodiments will be apparent from consideration of the specification and practice of the embodiments disclosed herein. It is intended that the specification and examples be considered as example only, with a true scope and spirit of the disclosed embodiments being indicated by the following claims.

What is claimed is:

1. A computer-implemented method for reconstructing a motion-compensated MR image, the method comprising:
   receiving a set of k-space data from an MRI device;
   dividing the set of k-space data into a plurality of groups;
   performing a plurality of initialization operations;
   performing a first iterative process until a first criteria for the first iterative process is achieved, the first iterative process outputting, for a current scale of motion estimation,
      a set of deformation coefficients of a motion estimation model for each group of k-space data; and
      a motion-compensated MR image reconstructed based on all the sets of the deformation coefficients and all the groups of k-space data; and
   performing a second iterative process until a second criteria for the second iterative process is achieved, the second iterative process outputting
      a final motion-compensated MR image reconstructed based on the output of the first iterative process and a predetermined scale of motion estimation.

2. The computer-implemented method of claim 1, wherein the set of k-space data comprises a plurality of subsets of k-space data simultaneously acquired using a plurality of coil arrays.

3. The computer-implemented method of claim 1, wherein the set of k-space data was acquired according to a sampling pattern selected for parallel imaging, wherein the sampling pattern is a radial trajectory or a spiral trajectory.

4. The computer-implemented method of claim 3, wherein the sampling pattern is a variable-density sampling pattern.

5. The computer-implemented method of claim 1, wherein each iteration of the first iterative process comprises
   estimating a set of deformation coefficients of the motion estimation model for each group of k-space data; and
   reconstructing the motion-compensated MR image based on all the sets of the deformation coefficients and all the groups of k-space data.

6. The computer-implemented method of claim 1, wherein each iteration of the second iterative process comprises updating the current scale of motion estimation; and performing one or more iterations of the first iterative process.

7. The computer-implemented method of claim 1, wherein the plurality of initialization operations comprises set estimated motion during acquisition of a first group of k-space data to zero;

obtaining an initial coarse image; and setting an initial scale of motion estimation.

8. The computer-implemented method of claim 1, further comprising estimating the set of deformation coefficients of the motion estimation model for each group of k-space data via non-linear conjugate gradient optimization.

9. The computer-implemented method of claim 1, wherein the motion estimation model comprises a b-spline function and one or more regularization terms.

10. The computer-implemented method of claim 9, wherein the one or more regularization terms comprise a quadratic penalty function for constraining an extent of estimated motion.

11. The computer-implemented method of claim 9, wherein the one or more regularization terms comprise a quadratic penalty function for implementing a constraint selected for a parallel MR imaging technique.

12. A non-transitory computer readable medium that stores a set of instructions that is executable by at least one processor to cause the processor to perform a method for reconstructing a motion-compensated MR image, the method comprising:

receiving a set of k-space data from an MRI device;

dividing the set of k-space data into a plurality of groups;

performing a plurality of initialization operations;

performing a first iterative process until a first criteria for the first iterative process is achieved, the first iterative process outputting, for a current scale of motion estimation, a set of deformation coefficients of a motion estimation model for each group of k-space data; and a motion-compensated MR image reconstructed based on all the sets of the deformation coefficients and all the groups of k-space data; and performing a second iterative process until a second criteria for the second iterative process is achieved, the second iterative process outputting a final motion-compensated MR image reconstructed based on the output of the first iterative process and a predetermined scale of motion estimation.

13. The non-transitory computer readable medium of claim 12, wherein the set of k-space data comprises a plurality of subsets of k-space data simultaneously acquired using a plurality of coil arrays.

14. The non-transitory computer readable medium of claim 12, wherein the set of k-space data was acquired according to a sampling pattern selected for parallel imaging, wherein the sampling pattern is a radial trajectory or a spiral trajectory.

15. The non-transitory computer readable medium of claim 14, wherein the sampling pattern is a variable-density sampling pattern.

16. The non-transitory computer readable medium of claim 12, wherein each iteration of the first iterative process comprises estimating a set of deformation coefficients of the motion estimation model for each group of k-space data; and reconstructing the motion-compensated MR image based on all the sets of the deformation coefficients and all the groups of k-space data.

17. The non-transitory computer readable medium of claim 12, wherein each iteration of the second iterative process comprises updating the current scale of motion estimation; and performing one or more iterations of the first iterative process.

18. The non-transitory computer readable medium of claim 12, wherein the plurality of initialization operations comprises set estimated motion during acquisition of a first group of k-space data to zero;

obtaining an initial coarse image; and setting an initial scale of motion estimation.

19. The non-transitory computer readable medium of claim 12, wherein the set of instructions that is executable by the at least one processor to cause the server to further perform estimating the set of deformation coefficients of the motion estimation model for each group of k-space data via non-linear conjugate gradient optimization.

20. A method for performing MRI, the method comprising:

acquiring a set of k-space data;

dividing the set of k-space data into a plurality of groups;

performing a plurality of initialization operations;

performing a first iterative process until a first criteria for the first iterative process is achieved, the first iterative process outputting, for a current scale of motion estimation, a set of deformation coefficients of a motion estimation model for each group of k-space data; and a motion-compensated MR image reconstructed based on all the sets of the deformation coefficients and all the groups of k-space data; and performing a second iterative process until a second criteria for the second iterative process is achieved, the second iterative process outputting a final motion-compensated MR image reconstructed based on the output of the first iterative process and a predetermined scale of motion estimation.

* * * * *